(12) United States Patent
Nishida et al.

(10) Patent No.: US 8,034,652 B2
(45) Date of Patent: Oct. 11, 2011

(54) SOLID STATE IMAGING DEVICE AND MANUFACTURING METHOD THEREOF

(75) Inventors: Kazuhiro Nishida, Minami-ashigara (JP); Hitoshi Shimamura, Kurokawa-gun (JP); Kosuke Takasaki, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 860 days.

(21) Appl. No.: 11/887,116

(22) PCT Filed: Mar. 24, 2006

(86) PCT No.: PCT/JP2006/306771
§ 371 (c)(1),
(2), (4) Date: Sep. 25, 2007

(87) PCT Pub. No.: WO2006/101270
PCT Pub. Date: Sep. 28, 2006

(65) Prior Publication Data
US 2009/0046183 A1 Feb. 19, 2009

(30) Foreign Application Priority Data
Mar. 25, 2005 (JP) .................. 2005-087968

(51) Int. Cl.
*H01L 21/00* (2006.01)
(52) U.S. Cl. ........ 438/66; 438/294; 438/57; 438/64
(58) Field of Classification Search ............ 438/57, 438/64, 66
See application file for complete search history.

(56) References Cited

U.S. PATENT DOCUMENTS

| | | | |
|---|---|---|---|
| 5,536,970 | A | 7/1996 | Higashi et al. |
| 5,593,926 | A | 1/1997 | Fujihira |
| 6,777,767 | B2 | 8/2004 | Badehi |
| 2004/0016886 | A1 | 1/2004 | Ringermacher et al. |
| 2004/0061799 | A1 | 4/2004 | Atarashi et al. |

(Continued)

FOREIGN PATENT DOCUMENTS

EP  647967 A2  4/1995

(Continued)

OTHER PUBLICATIONS

"Next generation packaging method with through electrode on a semiconductor chip is established at practical level", Association of Super-Advanced Electronics Technologies, Electronic Research Lab., Feb. 15, 2005, Internet, <URL: http://www.aset.or.jp/press_release/si_20040218/si_20040218.html >.

(Continued)

*Primary Examiner* — Thinh T Nguyen
(74) *Attorney, Agent, or Firm* — Sughrue Mion, PLLC

(57) ABSTRACT

A plurality of sensor packages (4) are fixed to a circuit assembly board (47) and placed on a lower mold die (56) of a transfer molding apparatus (54). Attached inside a cavity (58a) of an upper mold die (58) is a protection sheet (65), which will make contact with the upper face of a cover glass (6) of each sensor package (4). When the upper mold die (58) meshes with the lower mold die (56), the upper face of the cover glass (6) is tightly covered with the protection sheet (65). A plunger (62) is activated to fill the cavities (56a, 58a) with sealing resin (7). The upper face of the cover glass (6) is not stained or damaged when the peripheries of the sensor packages (4) are sealed.

39 Claims, 19 Drawing Sheets

U.S. PATENT DOCUMENTS

| | | |
|---|---|---|
| 2004/0159920 A1 | 8/2004 | Omori |
| 2004/0164981 A1 | 8/2004 | Fujita et al. |
| 2004/0188699 A1* | 9/2004 | Kameyama et al. ............ 257/99 |
| 2004/0266980 A1 | 12/2004 | Ideno et al. |
| 2005/0059188 A1 | 3/2005 | Bolken et al. |
| 2005/0255627 A1 | 11/2005 | Omori |
| 2006/0038250 A1 | 2/2006 | Omori |
| 2009/0053850 A1* | 2/2009 | Nishida et al. .................. 438/64 |

FOREIGN PATENT DOCUMENTS

| | | |
|---|---|---|
| EP | 1 408 556 A2 | 4/2004 |
| EP | 1 445 803 A2 | 8/2004 |
| EP | 1 493 766 A1 | 1/2005 |
| JP | 61-148824 A | 7/1986 |
| JP | 06-236899 A | 8/1994 |
| JP | 10-340914 A | 12/1998 |
| JP | 2001-257334 A | 9/2001 |
| JP | 2003-212963 A | 7/2003 |
| JP | 2004-64087 A | 2/2004 |
| JP | 2004-180243 A | 6/2004 |
| JP | 2004-193600 A | 7/2004 |
| JP | 2004-304081 A | 10/2004 |
| JP | 2004-363400 A | 12/2004 |

OTHER PUBLICATIONS

EP Communication, dated Mar. 21, 2011, issued in corresponding EP Application No. 06730719.9, 14 pages.

* cited by examiner

MANUFACTURING PROCESS FOR SOLID STATE IMAGING DEVICE

MANUFACTURING PROCESS FOR SOLID STATE IMAGING DEVICE

SOLID STATE IMAGING DEVICE AND MANUFACTURING METHOD THEREOF

CROSS REFERENCE TO RELATED APPLICATIONS

This application is a National Stage of International Application No. PCT/JP2006/306771, filed on Mar. 24, 2006, claiming priority based on Japanese Patent Application No. 2005-087968, filed Mar. 25, 2005, the contents of all of which are incorporated herein by reference in their entirety.

TECHNICAL FIELD

The present invention relates to a manufacturing method of solid state imaging devices, and more particularly to a manufacturing method of a solid state imaging device with a resin sealed sensor package, and the resulting solid state imaging device.

BACKGROUND ART

Digital cameras and video cameras with a solid state imaging device of either CCD type or CMOS type are in widespread use. Often, the solid state imaging device, together with a memory device, is incorporated in electrical equipments such as personal computers, mobile phones, and personal digital assistances to provide them with an image capturing function. An increasing demand for the solid state imaging devices is downsizing so that it does not affect the size of the electrical equipments greatly.

Solid state imaging device of chip scale package type (hereinafter "CSP") are known in the art. The CSP type solid state imaging device is composed of, for example, an imaging chip provided with both an image sensor (such as CCD) and input/output pads on the upper surface, a cover glass (i.e. cover) attached on the upper surface of the imaging chip through a spacer for sealing the imaging sensor, and external electrodes for connection to external devices. The CSP type solid state imaging device is packaged in approximately the size of the imaging chip, which is very small (see, for example, the Japanese patent laid-open publication No. 2001-257334).

Generally, the CSP type solid state imaging device is made in the following procedure:
1. forming a plurality of the image sensors (each with a photoelectric conversion section and a charge transfer section) and the corresponding input/output pads on the upper surface of a silicon wafer.
2. forming the spacers atop of the silicon wafer to enclose the image sensors individually.
3. attaching a glass substrate, i.e. a base material of the cover glass, to the silicon wafer through the spacer to seal each of the image sensors.
4. forming on the silicon wafer the external electrodes that correspond to the image sensors.
5. dicing the silicon wafer and the glass substrate into individual image sensors.

Since the CSP type solid state imaging device is as small as the imaging chip, the external electrodes are usually formed on the lower surface of the imaging chip. Therefore, with the conventional technique, the external electrodes on the lower surface are connected to the input/output pads on the upper surface of the image sensor in the formation process of the external electrodes. Concretely, they are connected either by through wirings that pass through the imaging chip or side wirings formed on the side faces of the imaging chip.

The external electrode with the through wiring may be formed in the following procedure (see, for example, "Press release, a next generation packaging method with a through electrode on a semiconductor chip is established at practical level" from Association of Super-Advanced Electronics Technologies, searched on Feb. 15, 2005, via the Internet, <URL:http://www.aset.or.jp/press_release/si_20040218/si_20040218.html>):
1. forming the through holes on the silicon wafer to extend from the lower surface to the input/output pads.
2. forming insulating thin layer on the inner walls of the through holes.
3. forming the through wirings of copper plate in the through holes.
4. forming, on the lower surface of the silicon wafer, secondary wirings to be connected with the through wirings.
5. forming solder balls on the secondary wirings.

On the other hand, the external electrode with the side wiring may be formed in the following procedure (see, for example, the U.S. Pat. No. 6,777,767 B2):
1. attaching a reinforcing board to the lower surface of the silicon wafer.
2. forming secondary wirings on the lower surface of the reinforcing board.
3. forming cutouts, which pass through between the lower surface of the reinforcing board and the input/output pads, at the portions that would become the side faces of the solid state imaging device.
4. forming conductive films inside the cutouts to connect the input/output pads and the secondary wirings.
5. forming solder balls on the secondary wirings.

When the silicon wafer is diced, the conductive films appear on the side faces of the solid state imaging device and become the side wirings.

Forming of the above through wirings requires a large number of processes, such as etching, film formation, and plating. Moreover, certain dedicated machines (for example, the etcher, the CVD machine, the plating machine) are required, which will raise the cost. Also required is much time for listing and evaluating the conditions, such as the shape of the through hole, the thickness of the insulating film and a conductive paste and so force, in order to ensure a certain level of the electric property and the reliability.

For the same reason, forming of the side wirings also raises the cost. Moreover, the side wirings cause to enlarge the solid state imaging device because the input/output pads have to be spaced at no less than 350 μm interval for the wires passing through the side faces to the lower surface. When it is enlarged, fewer solid state imaging devices can be produced from a single silicon wafer and the cost will be raised.

The Japanese patent laid-open publication No. 2001-257334 discloses a packaging method of the CSP type solid state imaging device. This method begins by fixing a sensor package (composed of an imaging chip and its cover glass) without external electrodes onto a circuit board made from a glass epoxy substrate. Then, input/output pads of the sensor package and conductive pads of the circuit board are joined by bonding wires. Finally, the periphery of the sensor package is sealed with sealing resin. This packaging method enables to use the conventional post-process technique and facilities for semiconductor devices.

Although it becomes somewhat large, this kind of resin sealed package enables to produce the reliable solid state imaging devices at low cost, and solve the above mentioned drawbacks of the through wirings and the side wirings as well. In addition, the sealing resin seals a cavity enclosed by the imaging chip, the spacer, and cover glass, preventing electrical problems in the image sensor.

However, the Japanese patent laid-open publication No. 2001-257334 is silent about how to protect the upper face of the cover glass in the sealing process. If the upper face of the cover glass is overlaid, stained, or damaged by the resin, the yield is decreased and the cost is raised. Therefore, a development of an effective resin sealing method able to protect the upper surface of the cover glass is highly demanded.

In the meanwhile, one of the interests of the art is a so-called "system-in-package" (hereinafter "SIP"), which packs a plurality of IC chips, normally mounted separate on the circuit board, into a single package as a system. For the SIP of a CPU and memories, there is no need to expose the IC chips. In contrast, when the above sensor package is packed in the SIP, the cover glass has to be exposed and, therefore, care must be taken for arrangement of the sensor package.

While the resin sealed sensor packages have been used in various semiconductor devices, they are known for a problem of moisture absorption by the sealing resin. This problem occurs when the semiconductor device in the resin seal package is soldered by a solder reflow machine. The moisture in the sealing resin is heated and causes a steam explosion, which makes some cracks in the sealing resin or at the boundary of the sealing resin and the sensor package. Therefore, the sealing resin peels off from the sensor package or the circuit board.

If this problem occurs in the solid state imaging device of the Japanese patent laid-open publication No. 2001-257334, the cracks or the peeling off of the sealing resin lead to remove the bonding wires connected to the input/output pads and the conductive pads. At the end, the solid state imaging device becomes inoperative. In addition, the moisture in the sealing resin dissolves ionic impurities out of the sealing resin, and an electrochemical decomposition reaction is thereby stimulated to possibly corrode the aluminum-made input/output pads. Furthermore, when the sealing resin peels off from the sensor package or the circuit board, the spacer and the cover glass may also come off, along with the sealing resin, from the imaging chip. This will cause other problems, such as fog on the cover glass and electrical malfunctions of the image sensor.

Despite the fact that the moisture absorption of the sealing resin causes various problems to the solid state imaging devices as described above, the Japanese patent laid-open publication No. 2001-257334 is silent about a solution to the moisture related problems. Therefore, a proper countermeasure to the moisture of the solid state imaging devices is highly demanded.

In view of the above, an object of the present invention is to provide a manufacturing method of the solid state imaging device that enables to seal the sensor package with resin while effectively protecting the cover glass for the image sensor. This manufacturing method of the solid state imaging device can also prevent negative effects of moisture. The resulting solid state imaging devices are also within the scope of the present invention.

DISCLOSURE OF INVENTION

In order to achieve the above and other objects, a manufacturing method of solid state imaging devices according to the present invention includes a die bonding step, a wire bonding step, a sealing step, a mold curing step, and a singulation step. In the die bonding step, sensor packages each having an image sensor covered by a cover are adhered onto a circuit assembly board. In the wire bonding step, input/output pads of each sensor package is connected to corresponding internal electrodes of the circuit assembly board with using bonding wires. In the sealing step, the upper face of the covers and under surface of the circuit assembly board are held between an upper mold die and a lower mold die, and sealing resin is filled into a cavity between said upper mold die and lower mold die to seal peripheries of the sensor packages. In the mold curing step, the sealing resin is heated for curing. In the singulation step, the circuit assembly board together with the sealing resin is cut into individual sensor packages.

According to the above manufacturing method, the upper mold die protects the upper face of the cover in the sealing step, and prevents the sealing resin to stick onto the cover. It is therefore possible to prevent the decrease in yield resulted from the stain of the cover caused by the sealing resin. Furthermore, the solid state imaging device except for the cover glass can be properly sealed. In addition, a plurality of solid state imaging devices can be manufactured at one time, and the cost will be reduced.

When the sensor package and at least one cooperating chip are adhered on the circuit assembly board to form a system-in-package, they are adhered such that the upper face of the cover is not hidden by the cooperating chip. Then the circuit assembly board is sealed while the upper mold die makes tight contact with the upper face of the cover to keep it off from the sealing resin. In this way, even for the SIP, the decrease in yield will also be prevented and the solid state imaging device can be properly sealed except for the cover glass. In addition, a plurality of solid state imaging devices in SIP can be manufactured at one time, and the cost will be reduced.

To adhere the sensor packages to the circuit assembly board, sheets of die attach material are used. If the die attach material is paste or liquid and the thickness of coating is not accurately controlled, the cover glass are not level with each other on the circuit assembly board. This may result to create a gap between the upper mold die and the cover glass, and the cover glass will be stained by the sealing resin. On the other hand, the sheet of die attach material has uniform thickness. Since the covers are level with each other on the circuit assembly board, the upper face thereof will be surely protected. Therefore, it is prevented that the sealing resin stains the cover to decrease the yield.

For even better protection of the cover from the sealing resin, a protection step may be provided to put protection sheets on the covers individually. With this step, the upper face of each cover is surely protected, and the decrease in yield due to the stain of the cover glass by the sealing resin can be prevented. The protection sheet should have resiliency and flexibility to absorb the difference in height between the cover glasses. Therefore, the cover glass is protected from direct pressing impact of the mold die.

The protection sheet is larger than a light receiving surface of the image sensor but smaller than the upper face of the cover. The protection sheet is adhered to the cover such that an edge of the protection sheet stays at between the edges of the image sensor and the upper face of said cover. If the edge of the protection sheet juts outside the cover glass, it may possibly bend and get into the sealing resin. Such protection sheet will leave a dent in the sealing resin when detached from the cover glass, and the sealing performance as well as appearance of the product is degraded. Since the protection sheet is arranged to stay within the upper face of the cover glass in the present invention, the foregoing problem will never occurs. In addition, the protection sheet does not impair the performance of image sensor because it is larger than the light receiving surface of the image sensor.

Alternatively, at least one protection sheet larger than the cover glass may be put over the covers of plural sensor packages. In this case, the number of protection sheets and the amount of work are reduced, and so does the cost.

Instead, a large protection sheet as large as the circuit assembly board may be put over all the sensor packages on the circuit assembly board. Since the protection sheet is adhered by a single work in this case, the amount of work is further reduced, and so does the cost.

Such protection sheet is held inside the upper mold die, which is used in the sealing step. Therefore, the protection sheet will cover the upper face of the cover when the upper and lower mold dies move to hold the upper face of the cover glass and the under surface of the circuit assembly board. This can eliminate the sheet adhesion operation.

The circuit assembly board may be a substrate base-board, and the external electrode may be either a solder ball or solder paste. The substrate base-board and the solder ball or paste are both reliable and cheap, and will serve for high yield and cost reduction.

Rather, the circuit assembly board may be a lead frame. In this case, outer leads of the lead frame are plated in the external electrode formation step. The lead frame is also reliable and cheap, and able to serve for high yield and cost reduction. It should be noted that the plating operation can be omitted if the lead frame is a PPF (Pre-plated Frame).

Furthermore, the circuit assembly board may be a tape substrate. In this case, if the tape substrate is made of a super heat resistant polyimide film, which drains moisture from the sealing resin, prevention of the steam explosion can be expected.

Between the die bonding step and the wire bonding step, a cleaning step may be provided for the sensor package, the cooperating chips, and the circuit assembly board. This cleaning step improves the adhesion of the sealing resin to the sensor package, and will improve reliability of the solid state imaging device. The method of cleaning may preferably be an UV cleaning or a plasma cleaning.

It is preferable that the die attach material has glass transition temperature lower than the heat curing temperature in the mold curing step. Such die attach material reaches the glass transition temperature with a low heat temperature at the beginning of the mold curing step, and serves to absorb the difference in thermal expansion coefficient between the imaging chip and the circuit assembly board. The sealing resin is therefore kept from the cracks and resultant peeling off. Preferably, the die attach material has a glass transition temperature of 50° C. to 80° C., and a thermal expansion coefficient of 80 to 100 ppm/° C.

An adhesive agent, for attachment of the imaging chip and the cover glass, may have the glass transition temperature higher than the heat curing temperature in the mold curing step, so that it does not reach the glass transition temperature to lose the adhesion force during the mold curing step. Nonetheless, the adhesive agent may have a relatively low glass transition temperature if the sealing resin has low thermal expansion coefficient and therefore gives less thermal stress on the adhesive agent at high temperature.

In order to prevent the cracks or the peeling off of the sealing resin from the sensor package and the circuit board, the sealing resin may preferably be high adhesion resin, which has excellent adhesion to the sensor package, the cooperating chips, and the circuit assembly board. The high adhesion resin will be, for example, biphenyl type epoxy resin.

Additionally, to ensure a steady flow of the sealing resin around the sensor packages, the sealing step is preferably carried out with the temperature of 165° C. to 180° C. and an injection pressure of 50 to 100 kg/cm$^2$. From the same reason, a spiral flow of the sealing resin may preferably be 110 cm and above.

The thermal expansion coefficient of the sealing resin is 20 ppm/° C. and preferably 8 ppm/° C., so that thermal stress can be reduced between the sensor package and the circuit board. From the same reason, the sealing resin preferably has a flexural modulus of 28 Gpa and below, and a mold shrinkage factor of 0.12% and below.

Since the cracks and the peeling off are more likely to occur as the trapped moisture increases in the sealing resin, a water absorption coefficient of the sealing resin is preferably 0.3% by weight and below, more preferably 0.15% by weight and below. In addition, for more reduction of the water absorption coefficient, the sealing resin may have a ratio of the filler material of no less than 80%.

Preferably, the glass transition temperature of the sealing resin is 130° C. and above to create a proper temperature cycle. Furthermore, in view of this glass transition temperature, the heat curing temperature is preferably around 150° C. in the mold curing step.

Furthermore, to ensure a proper level of strength in the solid state imaging device and prevent deformation thereof, the sealing resin should have a hardness of 90 shore D and above.

In order to prevent the corrosion of the input/output pads caused by the melting impurities out of the sealing resin, the sealing resin may preferably have a halogen and alkali contents of no more than 10 ppm respectively.

The solid state imaging device of the present invention may be composed of the sensor package, cooperating chips, the circuit board, bonding wires, the external electrodes, and the sealing resin for sealing the solid state imaging device except the cover of the sensor package. This enables low cost manufacture of a reliable, SIP type solid state imaging device that carries the sensor package and the cooperating chips necessary for the control of the sensor package.

Since the above system-in-package has to expose the upper face of the sensor package, the sensor package and the cooperating chips are adhered next to each other on the circuit board. It is also possible to stack the sensor package and cooperating chips to have a stacked system-in-package and, in this case, the sensor package is placed atop.

Also, in the solid state imaging device of the present invention, the cover may be provided with a chamfered edge or step edge so that the sealing resin can be kept from the cracks and peeling off. In this case, the sealing resin has an increased contact area with the sensor package, and the adhesion force is improved. Since the sealing efficiency is also improved for the cavity between the imaging chip, the spacer, and the cover, sufficient adhesion force is maintained between them even in either occasions where the pressure inside the cavity is increased at high temperature, a difference in thermal expansion occurs between them, and the moisture absorption of the sealing resin sets off the steam explosion. Instead of the chamfered or the bumped edges, it is possible to roughen the side faces of both or one of the imaging chip and the cover to create rough surfaces.

Furthermore, a high adhesion resin layer may be provided over the side faces of both or one of the imaging chip and the cover for tight contact to the sealing resin. The high adhesion resin layer allows tight contact of between the sealing resin and the sensor package, enhancing adhesion force of the sealing resin. Since the imaging chip and the spacer also become to make tight contact, the adhesion force is enhanced between them. As a result, the sealing efficiency is improved for the cavity between the imaging chip, the spacer, and the cover, and therefore sufficient adhesion force is maintained between them even in either occasions where the pressure inside the cavity is increased at high temperature, a difference in thermal expansion occurs between them, and the moisture absorption of the sealing resin sets off the steam explosion. The high adhesion resin layer will be, for example, a polyimide film.

For more improvement of the sealing efficiency on the cavity to block the moisture penetrating from the boundary of the sealing resin, it is possible to provide a moisture penetration preventive film over the outer side faces of the imaging chip, the spacer, and the cover. The moisture penetration preventive film will be, for example, a nitride thin film.

The cavity between the imaging chip and the cover may forms a vacuum or be filled with an inactive gas. Since there is little thermal expansion of air inside the cavity to produce a tension in this case, the spacer and the cover glass are kept from peeling off.

According to the present invention, it is possible to take the advantage of the CSP type solid state imaging device that it is small and to overcome the drawbacks of the through wirings and the side wirings, such as a high cost of manufacture, low reliability, and growth in chip size. Since the upper face of the cover for the sensor package will never be stained or damaged, the decrease of the yield is prevented and so does the rise in the price of the solid state imaging device. Additionally, it is possible to manufacture reliable system in packages at low cost.

The various modifications made in the present invention can be used separately or in combination to become an effective countermeasure to the problems caused by the moisture absorption of the sealing resin, such as the cracks, peeling off of the elements, and in operation of the device.

BEST MODE FOR CARRYING OUT THE INVENTION

Figure 1:
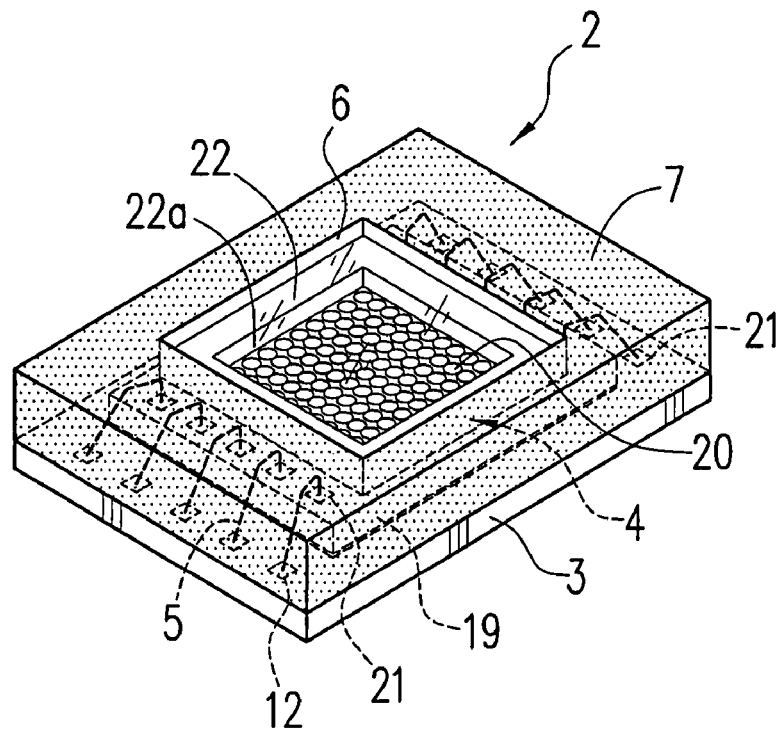
FIG. 1 is a perspective view of a solid state imaging device made according to the present invention.
Figure 2:
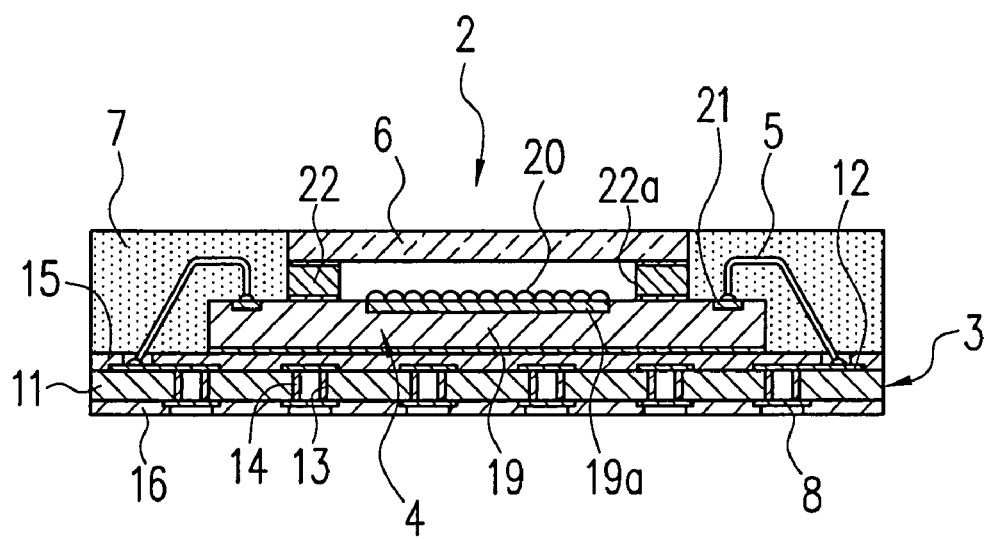
FIG. 2 is a cross sectional view of the solid state imaging device.

Referring now to FIG. 1 and FIG. 2, a solid state imaging device 2 of a first embodiment includes a rectangular circuit board 3, a sensor package 4 fixed onto the circuit board 3, a plurality of bonding wires 5 for connection between the circuit board 3 and the sensor package 4, sealing resin 7 that seals a periphery of a cover glass 6 of the sensor package 4, and external conductive pads 8 formed on the lower surface of the circuit board 3. The solid state imaging device 2 is in a package so called "Fine Pitch Land Grid Array (FLGA)". The FLGA package is prevalent in the art, and it is possible to manufacture reliable solid state imaging devices 2 at low cost.

The circuit board 3 is a substrate board (or printed board) fabricated from a base 11 of glass epoxy or the like. On a top surface of the base 11, a plurality of internal conductive pads 12, i.e. internal electrodes, are formed for connection with the sensor package 4 through the bonding wires 5. Formed on an under surface of the base 11 are the external conductive pads 8, i.e. external electrodes. These internal and external conductive pads 12 and 8 are made of, for example, copper (Cu) and electrically connected to each other by conductive films 14 formed in through holes 13 which run through the base 11. The top and under surfaces of the base 11 are covered with solder resists 15 and 16 except where the internal and the external conductive pads 12 and 8 occupy.

The sensor package 4 is composed of an imaging chip 19 of rectangular shape, an image sensor 19a such as CCD or CMOS provided on the upper surface of the imaging chip 19, a microlens array 20 attached on the image sensor 19a, a plurality of input/output pads 21 connected to the circuit board 3 through the bonding wires 5, the translucent cover glass 6 for sealing the image sensor 19a from above, and a spacer 22 held between the imaging chip 19 and the cover glass 6.

The imaging chip 19 is made by dividing a silicon wafer, on which a plurality of image sensors 19a and input/output pads 21 are arranged in matrix, into rectangular pieces. Each image sensor 19a includes a plurality of matrix arranged light receiving elements (photodiodes), on which a color filter (not shown) of RGB and a microlens 20 are overlaid. The input/output pads 21 are aligned along the two opposite sides across the image sensor 19a. The input/output pads 21 are, for example, gold (Au) or aluminum (Al) print and connected to the image sensor 19a through wirings, which are made of the same material and the same method as the input/output pad 21.

The spacer 22 is made of an inorganic material such as silicon, and has a frame shape with an opening 22a in the middle. The spacer 22 is attached to the upper surface of the imaging chip 19 such that it can surround the image sensor 19a to create a gap between the microlens array 20 and the cover glass 6. It is thereby prevented the physical contact of the microlens array 20 and the cover glass 6.

The cover glass 6 is low alpha ray emission glass and attached onto the spacer 22 such that it covers the opening 22a. The low alpha ray emission glass, which emits little alpha rays, can prevent the alpha rays to destruct the light receiving elements of the image sensor 19a. Additionally, an infrared cut filter and an optical low pass filter may be attached on the cover glass 6.

The sensor package 4 is die bonded onto the circuit board 3. The bonding wires 5 for connection between the input/output pads 21 and the internal conductive pads 12 may be made of Au or Al. The sealing resin 7 for sealing the periphery of the cover glass 6 is, for example, a thermosetting resin of epoxy that is conventionally used for the seal of ICs. The sealing resin 7 keeps the input/output pads 21, the internal conductive pads 12, and bonding wires 5 from the moisture and oxygen that will cause oxidization and corrosion. Also, the sealing resin 7 can improve the mechanical strength of the solid state imaging device 2.

Next, the manufacturing process for the solid state imaging device 2 is described with reference to the flow charts of FIG. 3 and FIG. 4. Note that each flow chart has lists, on both sides, of the materials and equipments used in each step of the process. The first step of the manufacturing process for the solid state imaging device 2 is the manufacture of the sensor package 4.

Figure 5A:
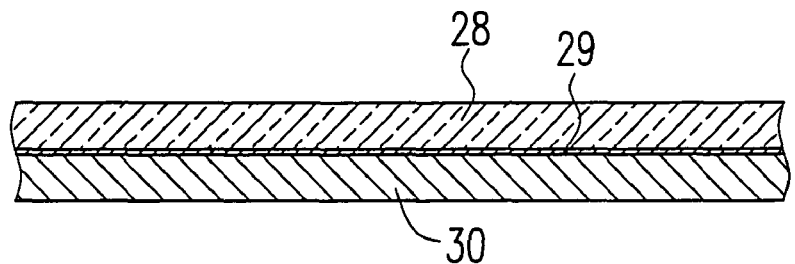
FIG. 5A-5G is an explanatory view illustrating formation of a spacer of the sensor package.

The manufacture of the sensor package 4 begins by attaching a glass substrate 28, i.e. a base material of the cover glass 6, to a spacer wafer 30, i.e. a base material of the spacer 22. As shown in FIG. 5A, an adhesive 29 is applied on the under surface of the glass substrate 28 with using a bar coater, blade coater, a spin coater, or such. Then, the spacer wafer 30 is attached underneath the glass substrate 28 with using a joint machine that can hold and move the glass substrate 28 and spacer wafer 30 parallel to each other. Although the adhesive 29 is typically a room temperature curing adhesive, it is possible to use any of UV curable adhesive, visible light curable adhesive, or heat curing adhesive. In addition, the attachment may be done under a vacuum state so that air does not enter in between the glass substrate 28 and the spacer wafer 30 at the time of the attachment.

Figure 5B:
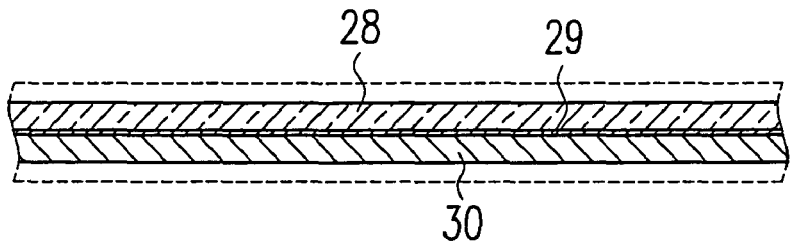

As shown in FIG. 5B, the glass substrate 28 and the spacer wafer 30 are made thinner. To facilitate the handling in attachment operation and to reduce the cost, the glass substrate 28 and the spacer wafer 30 are initially made with a standard, somewhat thick, materials. Therefore, they are made thinner to allow the minimization of the solid state imaging device 2 and time reduction in etching work. Used in this thinning work is, for example, a grinding and polishing machine.

Figure 5C:
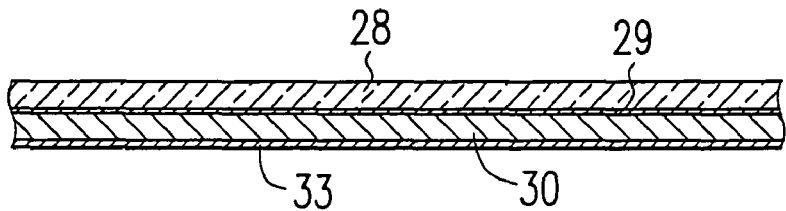
Figure 5D:
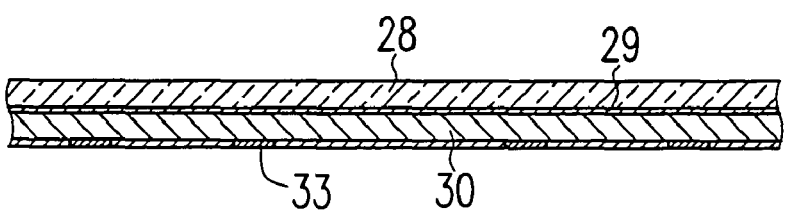
Figure 5E:
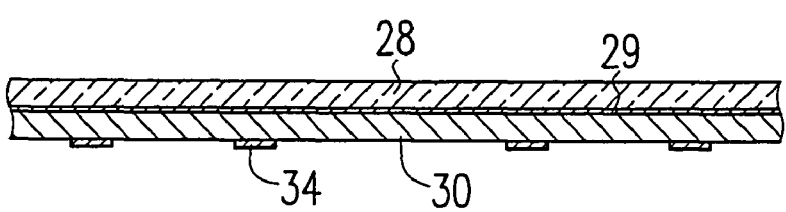

Subsequently, the spacer 22 is formed. As shown in FIG. 5C, a resist 33 is applied on the under surface of the spacer wafer 33. Then, as shown in FIG. 5D, the resist 33 is exposed and developed with using a predetermined mask, and thereby a resist mask 34 in the shape of the spacer 22 is formed as shown in FIG. 5E. To form the resist mask 34, a coater developer, an exposure machine, and a developing machine are used.

Figure 5F:
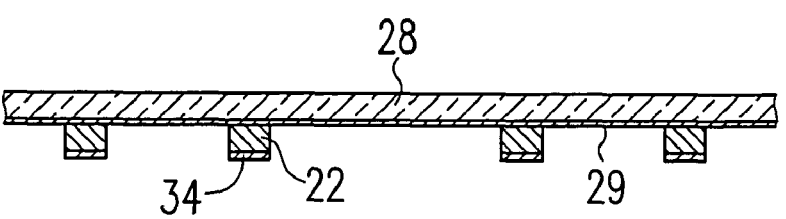
Figure 5G:
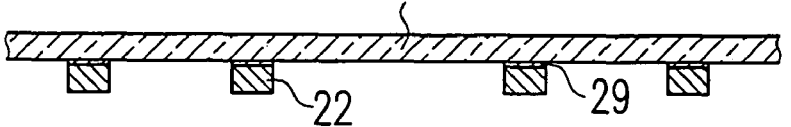

The spacer wafer 30 with the resist mask 34 is etched by a dry etcher and, as shown in FIG. 5F, unmasked areas are removed and a plurality of spacers 22 are created underneath the glass substrate 28. After etching, the resist mask 34 and the adhesive 29 are removed, as shown in FIG. 5G, with using a cleaning machine.

Figure 6A:
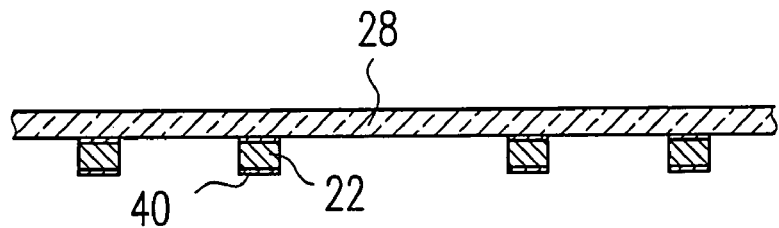
FIG. 6 is an explanatory view illustrating attachment operation of substrates and dicing operation of the solid state imaging device.
Figure 7:
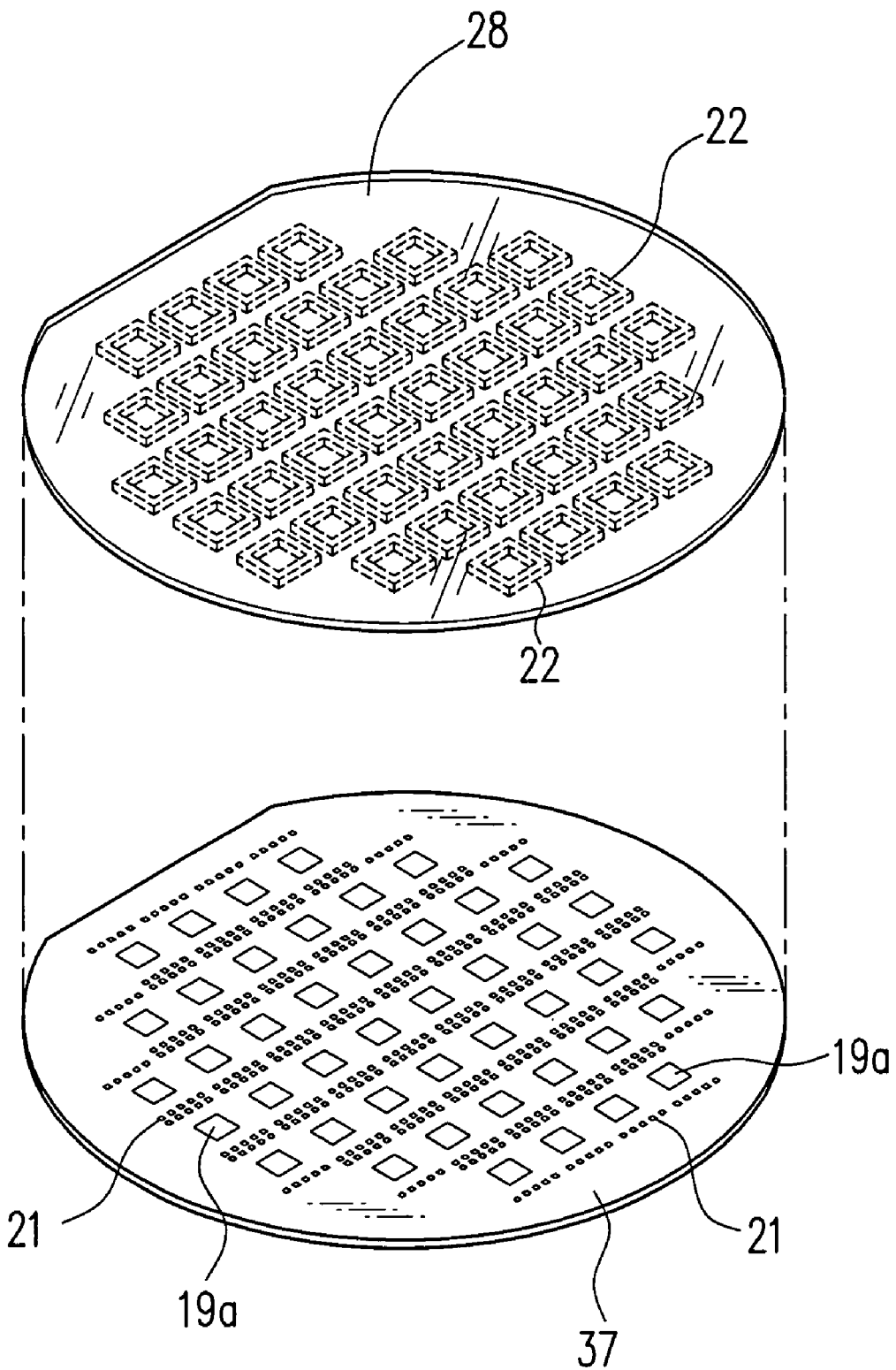
FIG. 7 is a perspective view of a glass substrate and a silicon wafer.

The glass substrate 28 with the spacers 22 thus created is attached to a silicon wafer 37, which has a plurality of image sensors 19a and input/output pads 21 formed thereon as shown in FIG. 7. Firstly, as shown in FIG. 6A, adhesives 40 are applied on the spacers 22. The adhesive 40 is typically a room temperature curing adhesive, but it is possible to use any of UV curable adhesive, visible light curable adhesive, or heat curing adhesive.

Figure 6B:
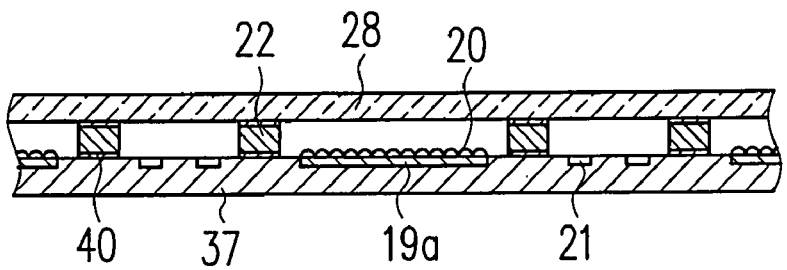

Then, as shown in FIG. 6B, the spacers 22 underneath the glass substrate 28 are attached to the silicon wafer 37. Since this attachment requires an accurate alignment between each image sensor 19a and spacer 22, a joint machine for this operation must have an alignment function to adjust the parallel relationship and horizontal relative positions between the image sensor 19a and the spacers 22. Each image sensor 19a on the silicon wafer 37 is sealed with the spacer 22 and the glass substrate 28, and will be kept free of dusts or shards generated in the subsequent step of the process.

Figure 6C:
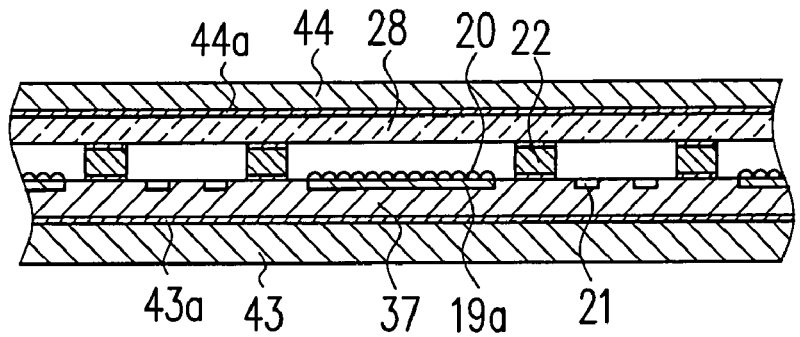

The glass substrate 28 is then diced, together with the silicon wafer 37, into individual image sensors 19a. Firstly, as shown in FIG. 6C, the silicon wafer 37 is fixed on an adhesive layer 43a of a dicing tape 43, and a protection tape 44 with an adhesive layer 44a is adhered on the glass substrate 28.

Figure 6D:
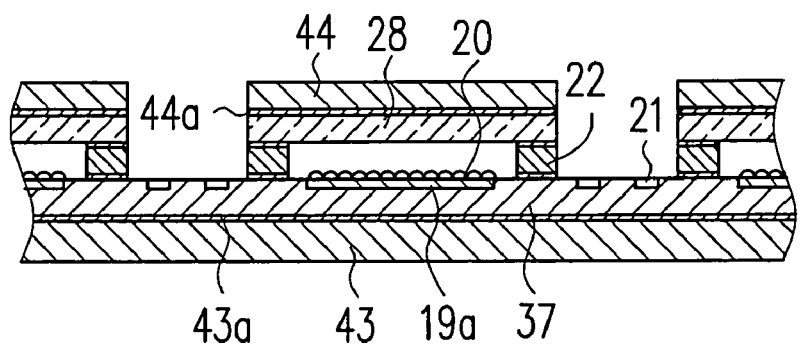
Figure 6E:
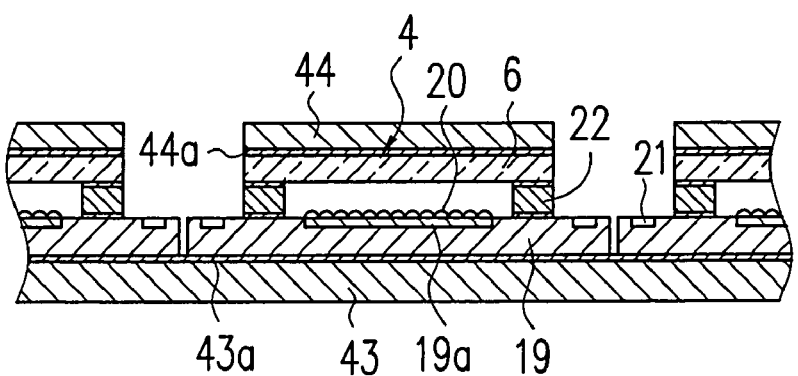

Then, as shown in FIG. 6D, the glass substrate 28 is diced along the edges of the spacers 22 with using a slicer. Finally, the silicone wafer 37 is diced into individual image sensors 19a, as shown in FIG. 6E, with using a dicer. In this manner, a plurality of the sensor packages 4 is formed at one time. For the protection of the cover glass 6 during shipment, the protection tape 44 may be left adhered. Alternatively, the protection tape 44 should be adhered on each cover glass 6 after dicing if not needed in the dicing operation.

The sensor packages 4 are separately inspected for performance by, for example, a probe inspection machine and only those passed this performance inspection will be detached from the dicing tape 43 and placed individually on trays or attached to a carrier tape for shipment. Alternatively, a plurality of the sensor packages 4 can be left attached to the dicing tape 43 and shipped.

Figure 3:
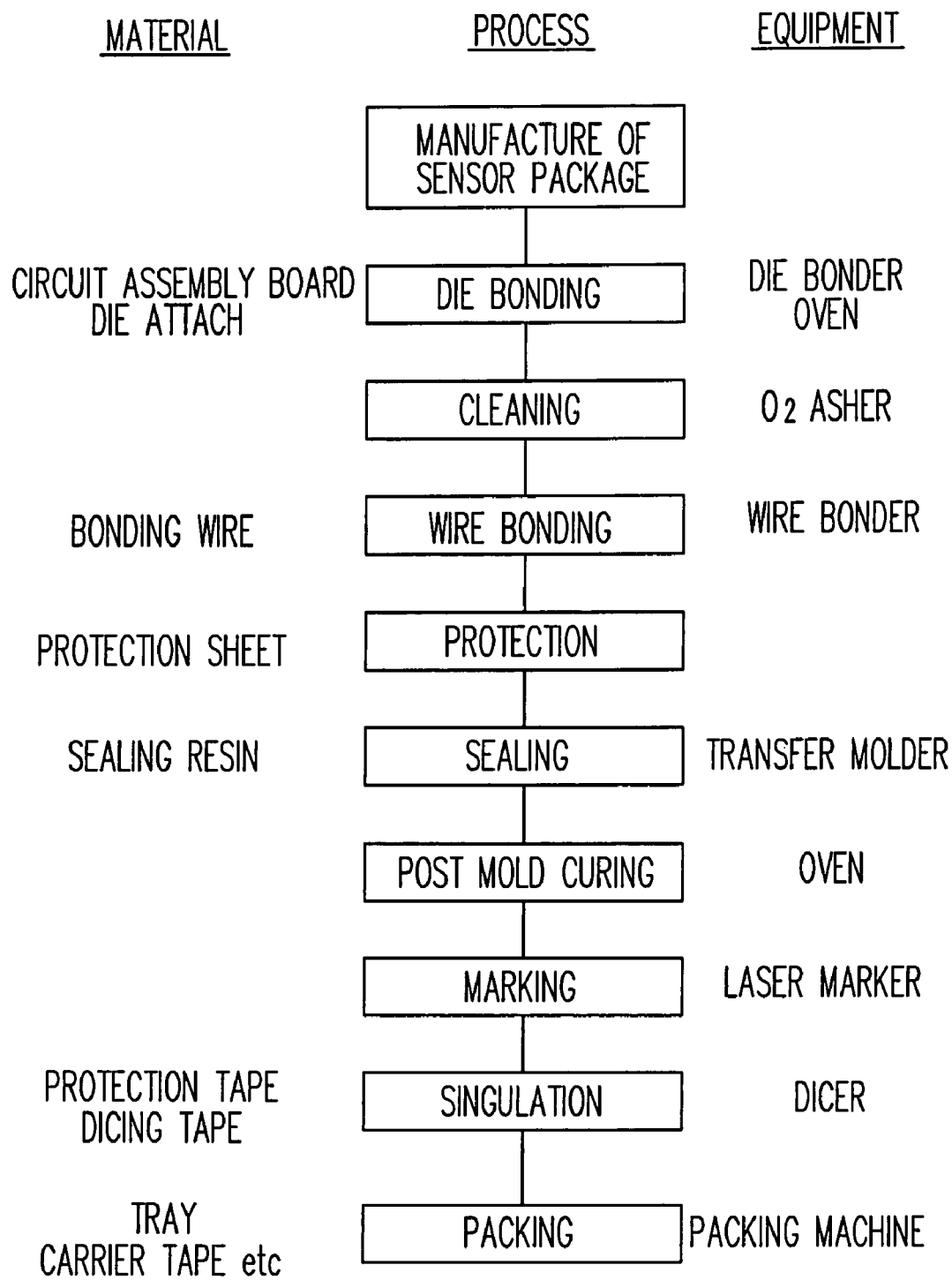
FIG. 3 is a flow chart of a manufacturing process for the solid state imaging device.
Figure 4:
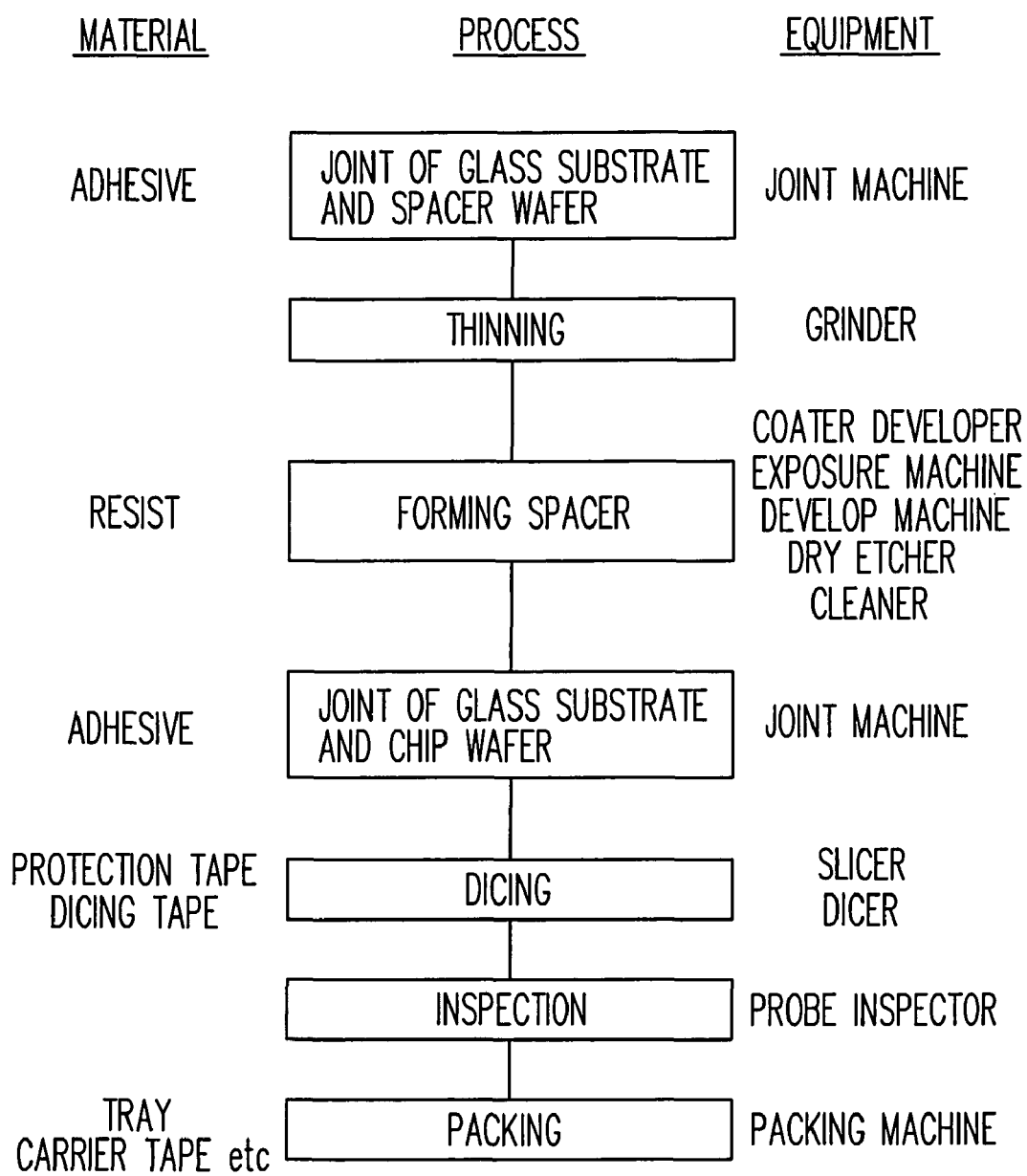
FIG. 4 is a flow chart of a manufacturing process for a sensor package.
Figure 8A:
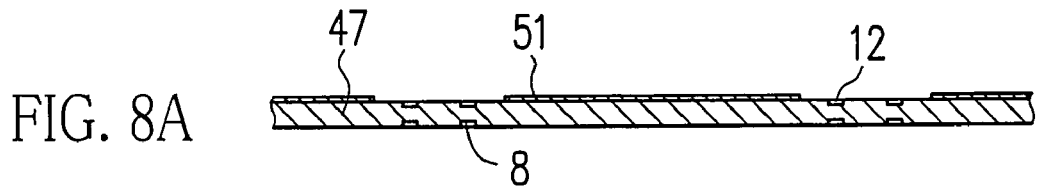
FIG. 8A-8F is an explanatory view illustrating the manufacturing process of the solid state imaging device.
Figure 9:
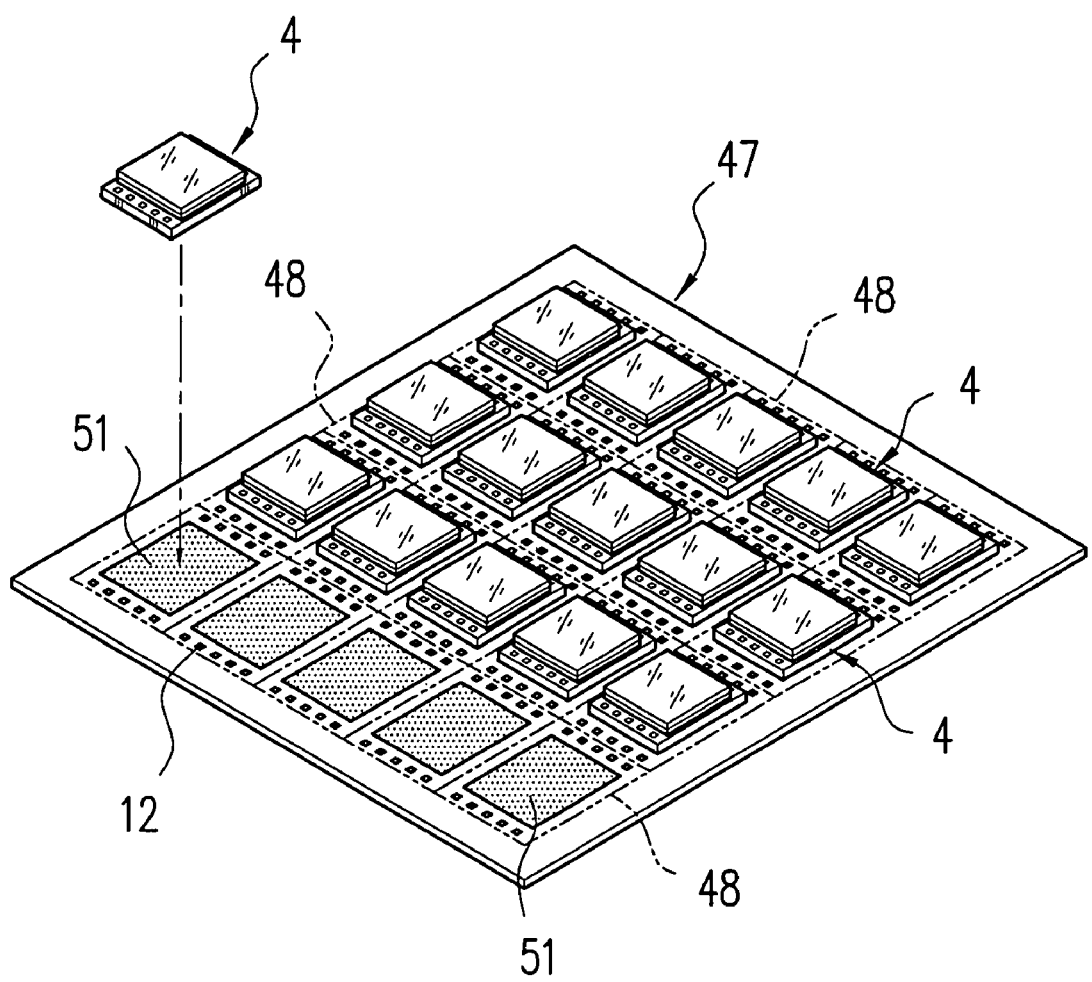
FIG. 9 is a perspective view of a circuit assembly board.

As shown in FIG. 3, the manufactured sensor packages 4 are die bonded onto a circuit assembly board 47, a large board with several circuit patterns of same kind. As shown in FIG. 8A and FIG. 9, the circuit assembly board 47 may be made from, for example, a glass epoxy substrate into a rectangular shape and is provided thereon with twenty, matrix arranged die bonding areas 48, on which the sensor packages 4 are die bonded individually. Each die bonding area 48 previously includes the internal conductive pads 12, the external conductive pads 8, and some others. Note that the number of the die bonding areas 48 is not limited to twenty and may be more or less.

Figure 8B:
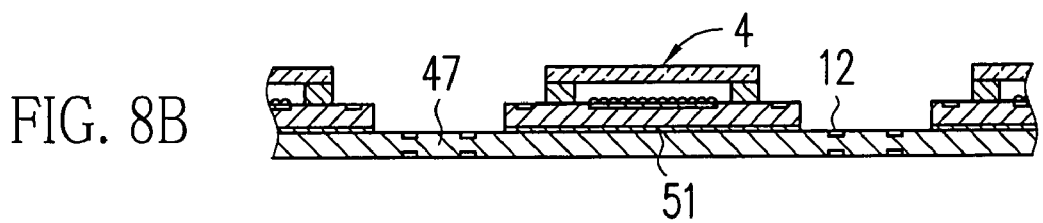

A die bonder for this die bonding operation firstly applies die attach films 51 on the die bonding areas 48 of the circuit assembly board 47. Then, as shown in FIG. 8B, the die bonder places the sensor packages 4 on each of the die attach films 51. The circuit assembly board 47 with the sensor packages 4 attached thereon is heated in a heating machine such as an oven, and the die attach films 51 become hardened. Thereby, the sensor packages 4 are fixed to the circuit assembly board 47.

If a paste or liquid of die attach material is to be used, the thickness of coating must be accurately controlled, or otherwise the upper faces of the cover glasses 6 are not level with each other on the circuit assembly board 47. If not level, some of the cover glasses 6 are not protected appropriately in the sealing process and may be stained with the sealing resin 7. In contrast, when the die attach film 51 is used as the die attach material, the upper faces of the cover glasses 6 are almost level with each other because the die attach film 51 has a uniform thickness. Since the upper face of the cover glass 6 is surely protected, it is possible to prevent the sealing resin 7 to stain the cover glass, which leads to decrease the yield. The die attach films 51 may be previously adhered to the sensor packages 4. Additionally, a paste of die attach material can be used if the cover glasses 6 can be level with each other.

In the next cleaning step, the sensor packages 4 and the circuit assembly board 47 are cleaned with using, for example, an $O_2$ asher. This cleaning step is performed to improve the adhesion of both the bonding wires and the sealing resin in the subsequent wire bonding step and sealing step.

Figure 8C:
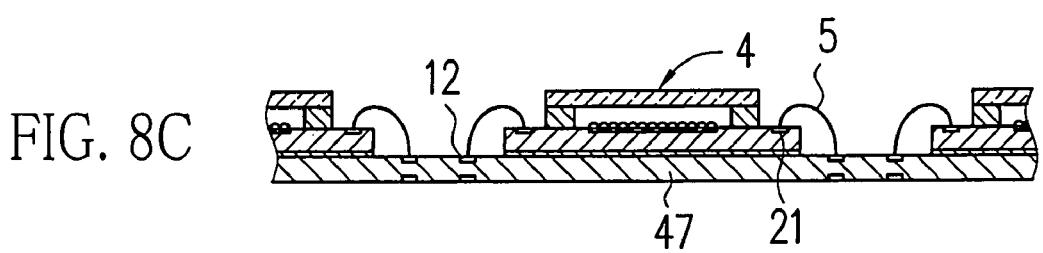

In the next wire bonding step, shown in FIG. 8C, the bonding wires 5 are attached by a wire bonder to connect the input/output pads 21 of each sensor package 4 and the internal conductive pads 12 of the die bonding areas 48. It is preferable in this wire bonding step to form a low loop of the bonding wire 5 so that it will stay below the cover glass 6.

Figure 8D:
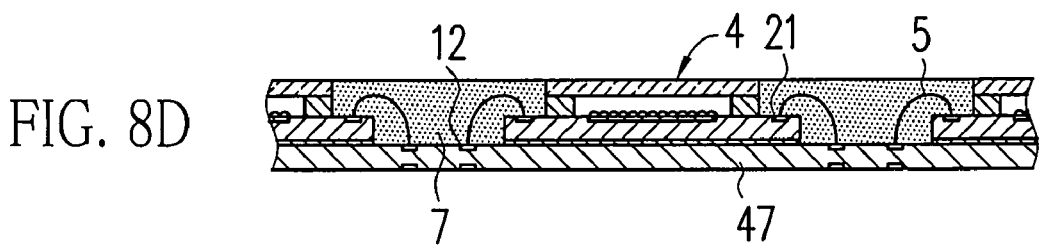

Afterward, as shown in FIG. 8D, the upper surface of the circuit assembly board 47 and the peripheries of the sensor packages 4 are sealed with the sealing resin 7. This sealing step includes an actual sealing operation and a protection operation to protect the upper face of each cover glass 6.

Figure 10A:
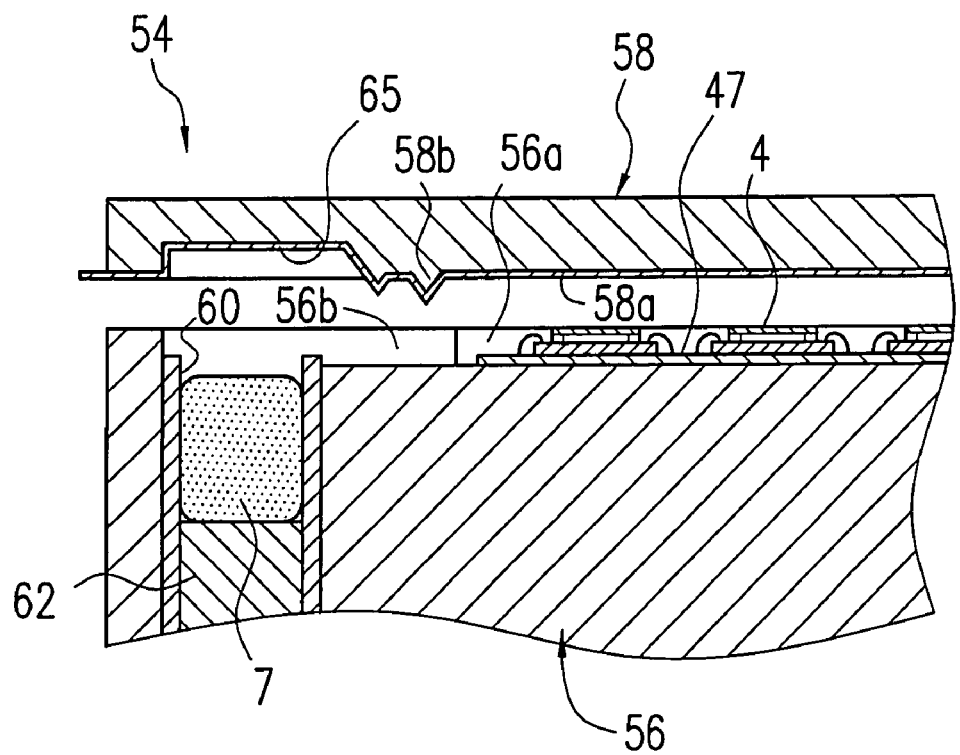
FIG. 10A-10B is a cross sectional view illustrating operation of a transfer molding machine.

The sealing operation is performed with a transfer molding apparatus 54 as shown in FIG. 10A. The transfer molding apparatus 54 has a lower mold die 56 and an upper mold die 58 that mesh with each other. The lower mold die 56 is constituted of a cavity 56a on which the circuit assembly board 47 is placed, a gate 56b for supplying the sealing resin 7 to the cavity 56a, a cull 60 connected to the gate 56b, and a plunger 62 that moves up and down in the cull 60 to fill the cavity 56a with the sealing resin 7 through the gate 56b. The upper mold die 58 includes a cavity 58a that makes contact with the cover glass 6 of each sensor package 4 and a projection 58b configured to reduce the cross sectional area of the gate 56b to raise inflow pressure of the sealing resin 7.

Figure 11:
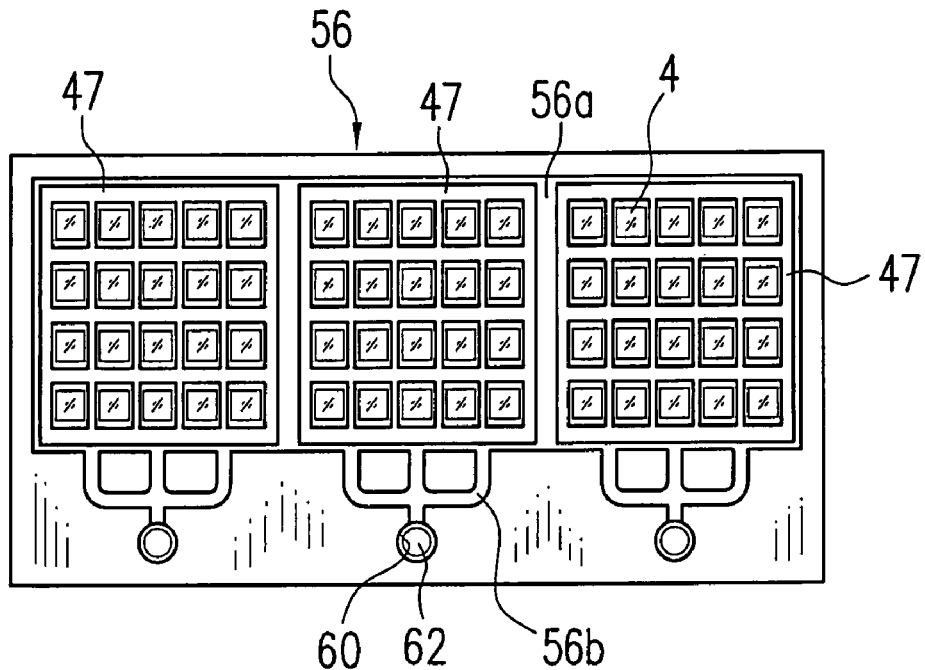
FIG. 11 is a plane view of a lower mold die.

As shown in FIG. 11, the upper and lower mold dies 56 and 58 may accept, for example, three circuit assembly boards 47 at one time, and be able to seal as many as 60 sensor packages 4 all together. To avoid errors of filling the sealing resin 7, the gate 56b, cull 60, and plunger 62 should be provided for each circuit assembly board 47. It is appreciated that the number of the circuit assembly boards 47 is not limited to three and may be more or less.

In the protection operation, a protection sheet 65 that is large enough to cover all the circuit assembly boards 47 is adhered in the cavity 58a of the upper mold die 58. The protection sheet 65 may be, for example, a flexible and resilient plastic film of polyimide with 80 to 100 μm thickness, and is attached tightly inside the cavity 58a by a vacuum suction technique.

Figure 10B:
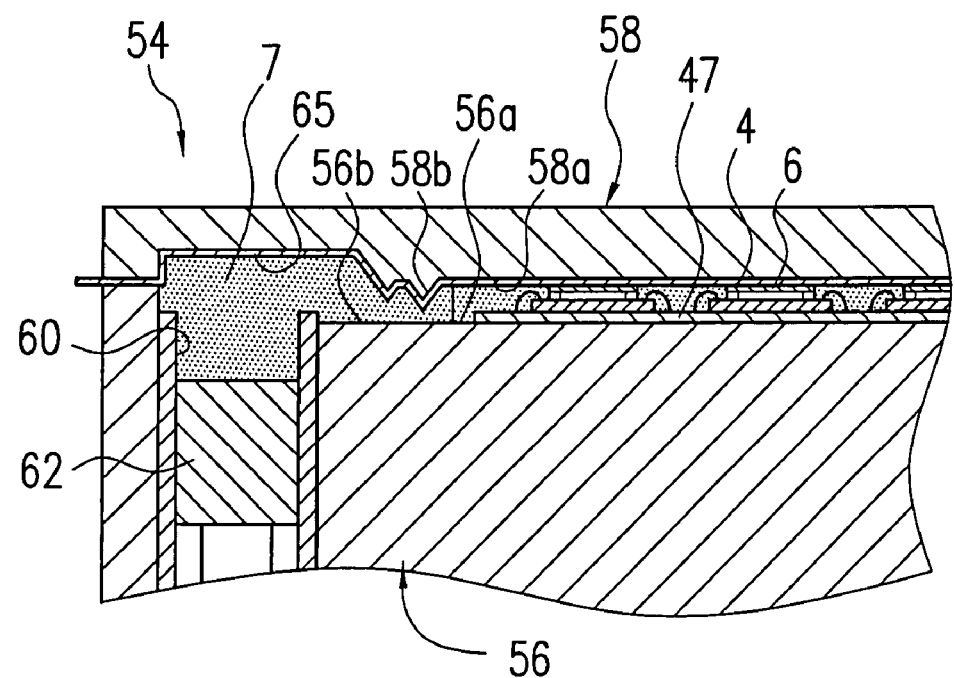

The above sealing operation will be carried out in the following manner. Firstly, the upper and lower mold dies 56 and 58 are pre-heated by a heater, and three circuit assembly boards 47 are placed in the cavity 56a of the lower mold die 56. Then, a thermosetting resin such as a tablet of epoxy sealing resin 7 is set in the cull 60, and the upper mold die 58 is descended, as shown in FIG. 10B, to mesh with the lower mold die 56. The upper face of each cover glass 6 is thereby tightly covered with the protection sheet 65.

The sealing resin 7 is softened by heat of the lower mold die 56. As the plunger 62 moves upwards, the sealing resin 7 flows through the gate 56b into the cavities 56a and 58a to fill the periphery of the sensor packages 4. At this point, the cover glasses 6 are level with each other owing to the uniform thickness of the die attach films 51. Additionally, the flexible and resilient protection sheet 65 absorbs difference in height, if any, between the cover glasses 6 as it tightly contact with them. Therefore, the sealing resin 7 never sticks to the upper faces of the cover glasses 6. Note that the protection sheet 65 is not limited to the polyimide film and any material may be used, as long as it combines all the characteristics of adhesion for tight contact with the cover glass 6, flexibility and resiliency to absorb the difference in height between the cover glasses 6, and tolerance to heat of the sealing resin 7 when filled.

After the filling, the sealing resin 7 is left stable for minutes with more clamping pressure put onto the mold dies, so that sealing resin 7 polymerizes and hardens. The upper mold die 58 is lifted to take out the sealed circuit assembly boards 47 from the lower mold die 56. The lamps of remaining resin in both the cull 60 and the gate 56b are removed, and the protection sheet 65 is detached from the cover glasses 6.

The epoxy resin for such transfer molding should preferably have a spiral flow of 100 cm, a flexural modulus of 28 GPa, and a coefficient of thermal expansion of 8 ppm. It is preferable that the lower and upper mold dies 56 and 58 are pre-heated for three minutes at the temperature of 180° C. before the filling of the epoxy resin.

Immediately after the molding operation, the sealing resin 7 is still under polymerization and unstable in character. Therefore, a subsequent is a post mold curing (PMC) step, in which the circuit assembly boards 47 out of the transfer molding apparatus 54 are placed in an oven or the like and heated for curing of the sealing resin 7.

Performed after the sealing is a marking step, in which information such as a manufacturer name, product name, product number, and lot number is printed on the sealing resin 7 with a laser marker.

Figure 8E:
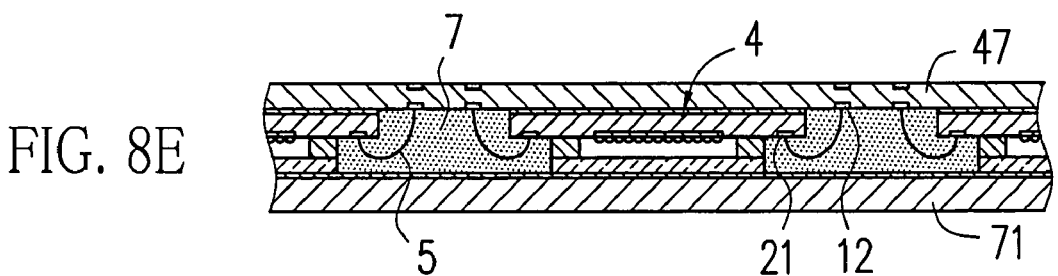
Figure 8F:
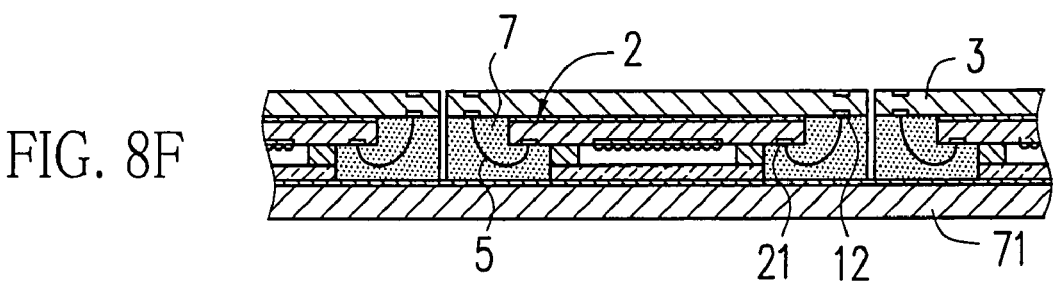

Following is a singulation step, where the circuit assembly board 47 is separated together with sealing resin 7 into individual sensor packages 4. As shown in FIG. 8E, the circuit assembly board 47 is placed on a dicing tape 71 such that the cover glass 6 faces the dicing tape 71. Then, as shown in FIG. 8F, the sealing resin 7 and the circuit assembly board 47 are diced, from the back side, by a dicer into individual sensor packages 4. Thereby, a plurality of the solid state imaging devices 2 can be produced at one time.

In the next packing step, the solid state imaging devices 2 are detached from the dicing tape 71 and put individually on a tray by a packing machine or attached to the carrier tape for shipment. Also, it is possible to ship several solid state imaging devices 2 remained on the dicing tape 71.

Although the above embodiment uses the protection sheet 65 that is larger than three circuit assembly boards 47, it is possible to use three protection sheets each of which is approximately the same size as a single circuit assembly board 47, or to use several protection sheets each of which is able to protect several cover glasses 6. Alternatively, no protection sheet will be used and the upper surface of the cover glass 6 is kept from the resin if the cover glasses 6 and the upper mold die 58 are all fairly flat.

Figure 12:
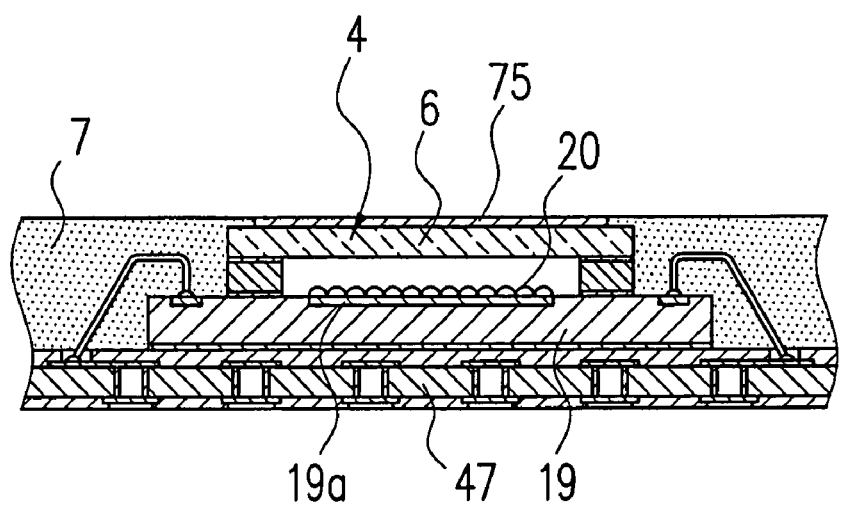
FIG. 12 is a cross sectional view of a cover glass with an individual protection sheet attached thereon.

Furthermore, each cover glass 6 may be protected by a separate protection sheet. For example, as shown in FIG. 12, the upper face of the cover glass 6 is attached to a protection sheet 75, which has a similar shape to the light receiving surface of the image sensor 19a and is larger than the light receiving surface but smaller than the upper face of the cover glass 6. It is better, in this case, to arrange the protection sheet 75 such that the edge of the protection sheet 75 stays at between the edges of the light receiving surface of the image sensor 19a and the upper face of the cover glass 6. The protection sheets 75 may be attached individually to the cover glasses 6, or attached all together with using the upper mold die 58.

Of importance, if the edge of the protection sheet 75 juts outside the cover glass 6, it will bend and get into the sealing resin 7 in the filling operation. Such protection sheet 75 will leave a print, e.g. a dent, in the sealing resin 7 when detached from the cover glass 6, and the sealing performance as well as appearance of the sealing resin is degraded. In the present embodiment, however, the edge of the protection sheet 75 stays within the upper face of the cover glass 6, and the foregoing problem will never occurs. In addition, the protection sheet 75 does not impair the performance of image sensor 19a because it is larger than the light receiving surface of the image sensor 19a.

Figure 13:
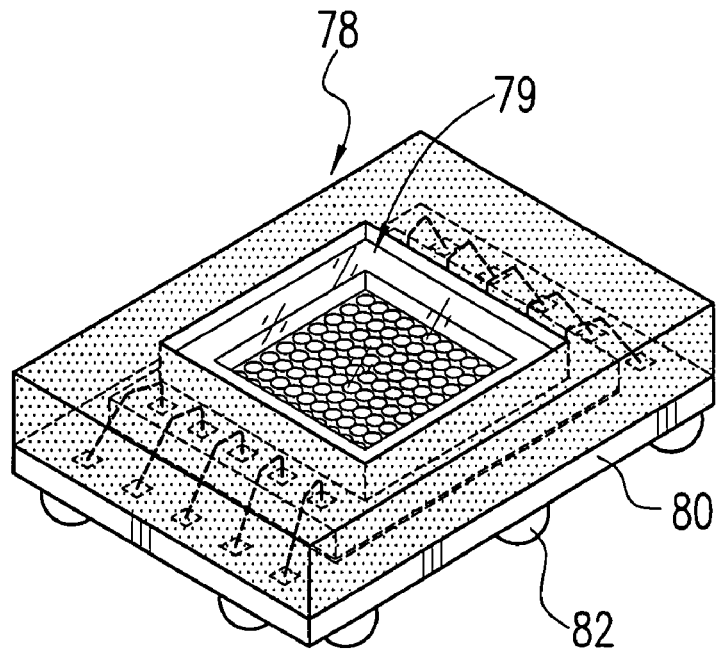
FIG. 13 is a perspective view of the solid state imaging device in a FBGA package.
Figure 14:
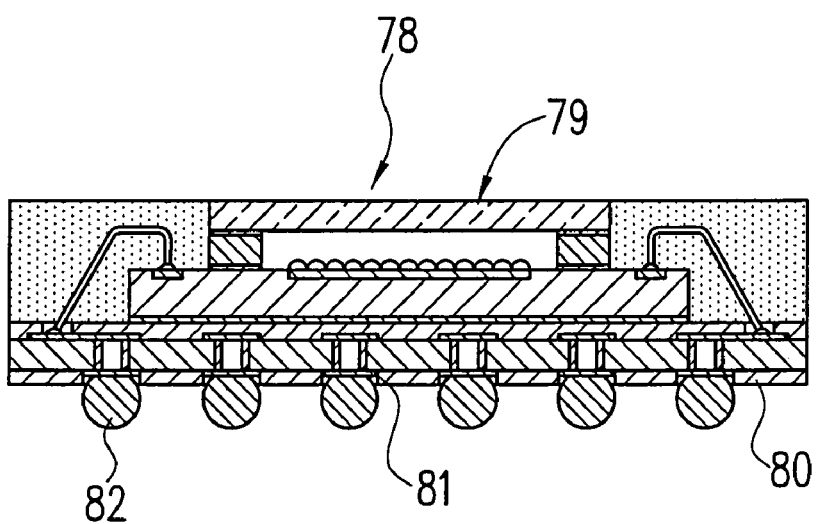
FIG. 14 is a cross sectional view of the solid state imaging device in the FBGA package.

Although the above embodiment is directed to the manufacturing method for the solid state imaging device in an FLGA package, the present invention is applicable to the solid state imaging device in a Fine Pitch Ball Grid Array (FBGA) package which uses solder balls as the external electrodes. As shown in FIG. 13 and FIG. 14, the solid state imaging device 78 of a second embodiment is provided with a solder ball 82 on each external conductive pads 81 of a circuit board 80, which is attached to a sensor package 79. The FBGA package is also prevalent in the art, and it is possible to manufacture reliable solid state imaging devices 78 at low cost.

Figure 15:
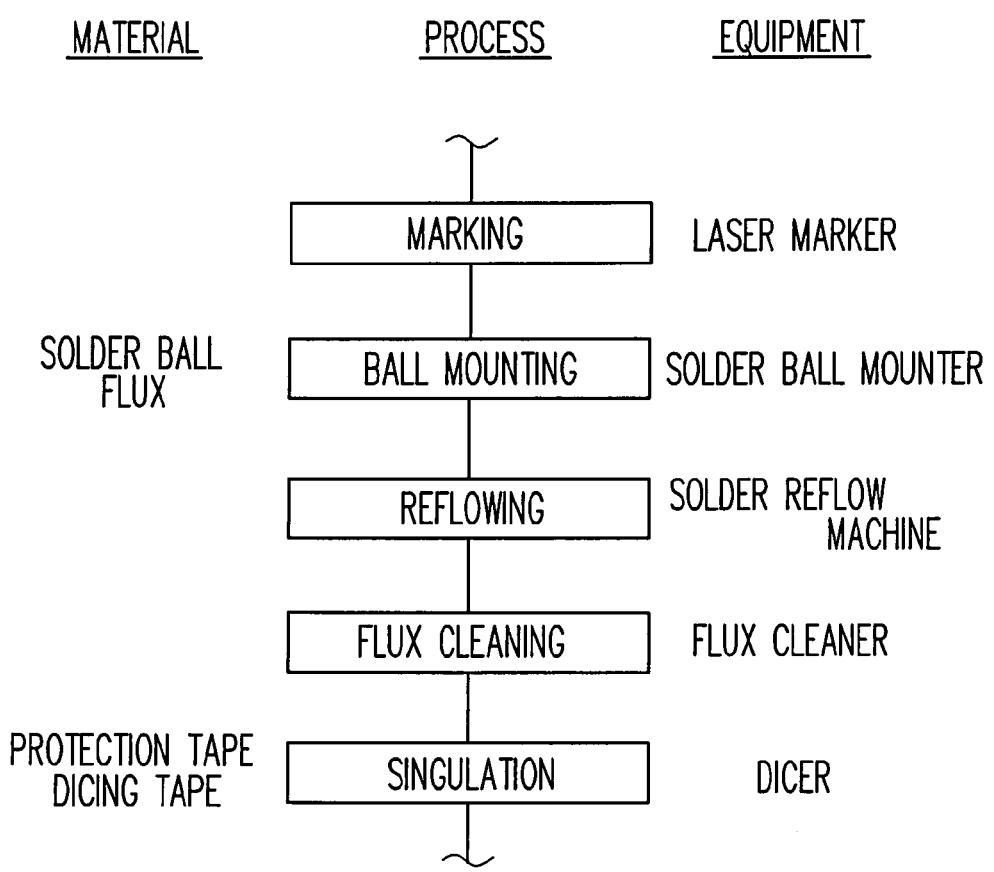
FIG. 15 is a flow chart of a manufacturing process for the solid state imaging device in the FBGA package.

To manufacture the solid state devices 78 in the FBGA packages, solder ball formation process are provided between the marking step and the singulation step, as shown by the flow chart of FIG. 15. The solder ball 82 is formed by, for example, a ball mounting method which includes a ball mounting step, a reflow step, and a cleaning step. Initially, in the ball mounting step, flux and solder are applied on the external conductive pads 81. Then the solder balls 82 are disposed by a solder ball mounter on the external conductive pads 81. In the reflow step, the solder is heated and melted by a solder reflow machine to fix the solder balls 82 onto the external conductive pads 81. Finally, the flux is removed using a flux cleaner in the cleaning step.

The aforementioned embodiments are described with the printed circuit board for the circuit assembly board. However, the circuit assembly board may be either a tape substrate or a lead frame. As is well known, the lead frame is a metal frame provided with die pads for attachment of chips, inner leads to be wire bonded to input/output pads of the chips, and outer leads as the external electrodes. The lead frame goes through the wire bonding step, sealing step, and singulation step after the sensor packages are die bonded to each of the die pads, and consequently the solid state imaging devices are produced.

Figure 16:
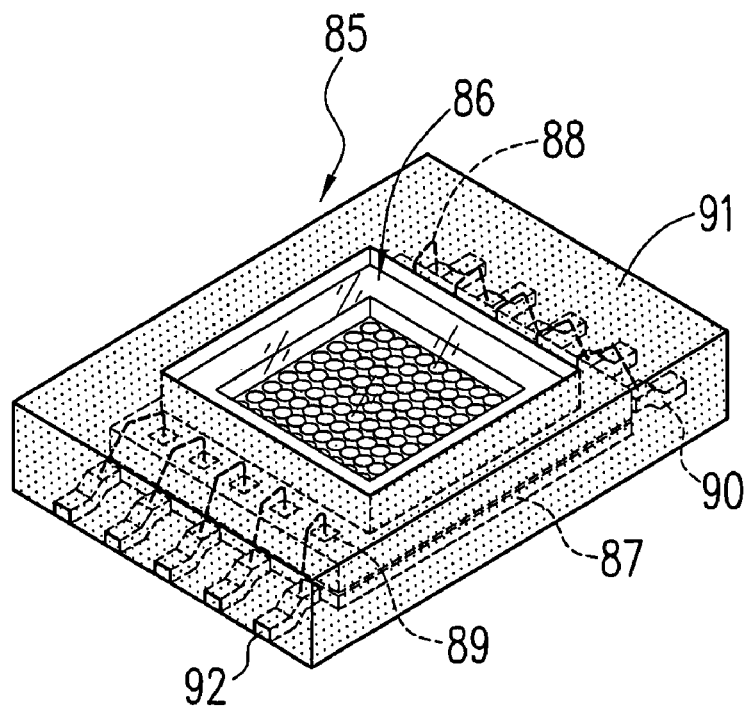
FIG. 16 is a perspective view of the solid state imaging device in a QFN package.
Figure 17:
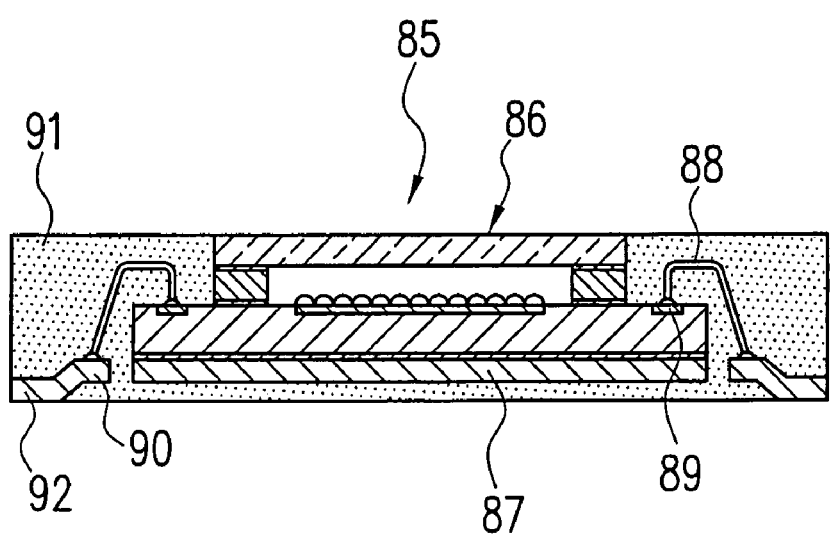
FIG. 17 is a cross sectional view of the solid state imaging device in the QFN package.

FIG. 16 and FIG. 17 show a solid state imaging device 85 of a third embodiment. Made from the lead frame, the solid state imaging device 85 is in a package called "Quad Flat Non-leaded (QFN)". The solid state imaging device 85 is constituted of a die pad 87 to which a sensor package 86 is fixed, inner leads 90 as internal electrodes connected through bonding wires 88 to input/output pads 89 of the sensor package 86, and outer leads 92 as external electrodes exposed at lower side faces of sealing resin 91. The QFN package is prevalent in the art, and it is possible to manufacture reliable solid state imaging devices 85 at low cost. Although the under surface of the die pad 87 is covered with the sealing resin 91, it may be exposed for better heat radiation of the sensor package 86.

Figure 18:
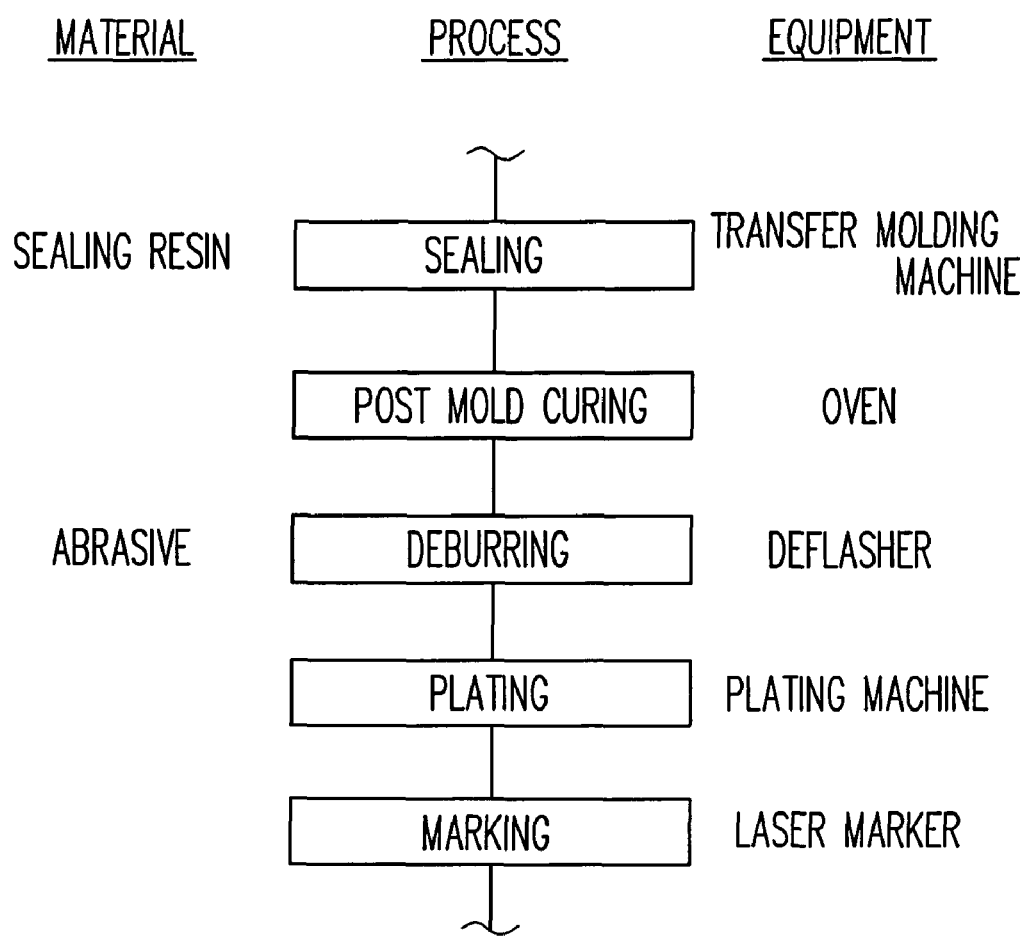
FIG. 18 is a flow chart of a manufacturing process for the solid state imaging device in the QFN package.

To manufacture the solid state imaging devices 85 in the QFN packages, a deburring step and a plating step are provided between the sealing step and the marking step, as shown by a flow chart of FIG. 18. In the deburring step, a deflasher is used to spray abrasives onto the sealing resin 91 so that the outer leads 92 are exposed. The exposed outer leads 92 are then plated in the plating step. The reason to perform the deburring before the marking step is to avoid the possibility for abrasives to damage the marks. It should be noted that the plating step can be omitted if the lead frame is a PD-PPF (Palladium Pre-plated frame).

Figure 19:
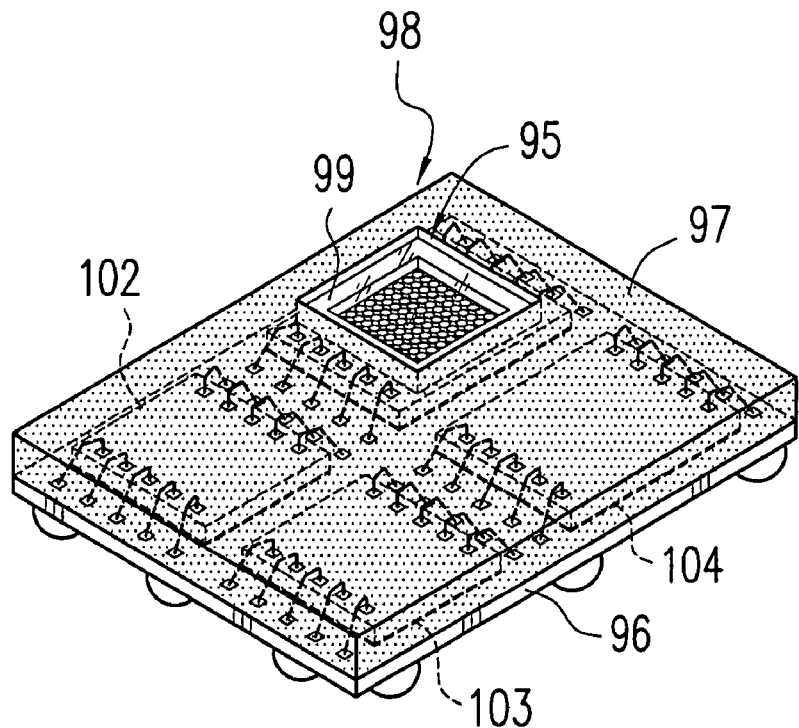
FIG. 19 is a perspective view of the solid state imaging device in a system-in-package.

Although the above embodiments are all described with a single package of solid state imaging device that only contains the sensor package, the present invention is applicable to a system-in-package (SIP) of solid state imaging device 98 (fourth embodiment) shown in FIG. 19. The solid state imaging device 98 is constituted of a sensor package 95 and several cooperating chips, which are all fixed on a circuit board 96 then sealed with sealing resin 97. With using the SIP solid state imaging device 98, a camera unit can be formed only by attaching an imaging optical system onto a cover glass 99. Therefore, the camera unit can be easily incorporated in various electrical equipments.

The cooperating chips may be, for example, an analog front end (AFE) chip 102 for digitization of the analog image signals from the sensor package 95, a digital signal processor (DSP) chip 103 for image processing of digitized image data, and a power supply chip 104.

Figure 20:
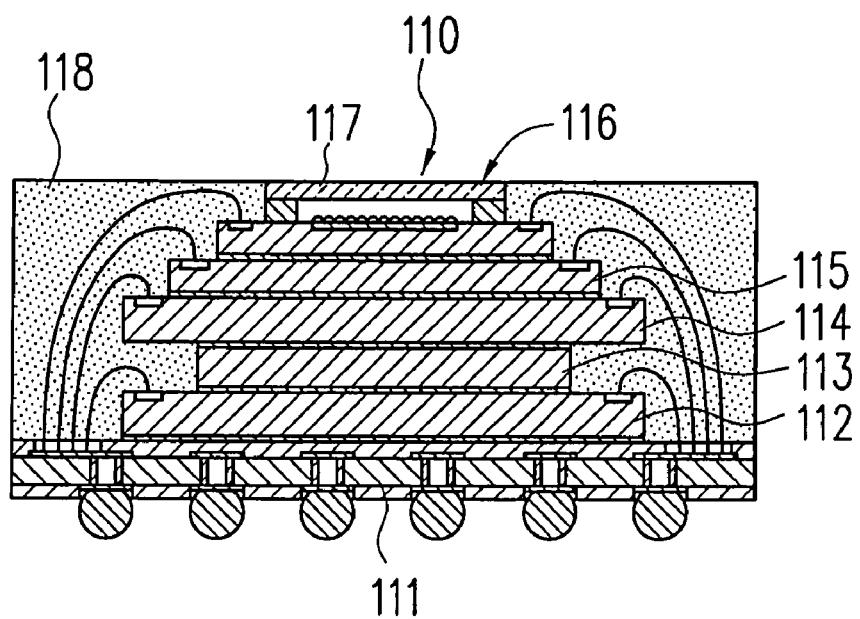
FIG. 20 is a cross sectional view of the solid state imaging device in a stacked system-in-package.

In addition, it is possible to stack a power supply chip 112, a spacer 113, a DSP chip 114, an AFE chip 115, and sensor package 116 on a circuit board 111 in this order to have a stacked system-in-package, such as a solid state imaging device 110 (fifth embodiment) in FIG. 20. In this case, the stack should be sealed with sealing resin 118 such that the upper face of the cover glass 117 of the sensor package 116 is exposed from the resin.

To manufacture the solid state imaging device 98 or 110 in SIP, the cooperating chips are treated together with the sensor package 95 or 116 in both the die bonding step and wire bonding step. In the sealing step, all the elements are sealed with the sealing resin 97 or 118 except the upper face of the cover glass 99 or 117. Further, in the singulation step, individual circuit boards 96 or 111 are cut out such that each of them has a group of chips for a single system.

The semiconductor devices, such as the solid state imaging device, should have high reliability enough to ensure a certain level of function and performance of the apparatuses that they belong to, over a predetermined period at the end users. Therefore, the semiconductor devices are generally checked in a standardized reliability test. There are some standards of measure for the semiconductor devices, and a notable one is the JEDEC (Joint Electron Device Engineering Council) standard. The JEDEC semiconductor standard specifies a reliable test for the semiconductor devices.

The reliable test of the JEDEC standard consists of two parts, a pre-condition test where the semiconductor device is put under stress that it would get before or at the time of installation in the various apparatuses and main test where the semiconductor device is put under a high stress that the device will get over a long duration in practical use. Of the two, the pre-condition test divides into 3 levels according to the amount of stress. The following are the conditions for the pre-condition test and the main test.

Reliability Test Conditions on the JEDEC Standard
1. Pre-Condition Test
  (1) high temperature high humidity storage condition
    level 1: 85° C., 85% humidity, 168 hours
    level 2: 85° C., 60% humidity, 168 hours
    level 3: 30° C., 60% humidity, 192 hours
  (2) reflow condition
    pre-heat: 160° C., 60 seconds
    main heat: 260° C., 20 seconds
2. Main Test
  (1) high temperature high humidity storage test: 85° C., 85% humidity, 1000 hours
  (2) temperature cycle test: 85° C.↔−40° C., 1000 cycles The solid state imaging device 2, made according to the first embodiment of the present invention, did not pass the above JEDEC reliability test because of a series of problems, which are the steam explosion of the moisture trapped in the sealing resin 7, the resulting cracks on the sealing resin 7 or the boundary of the sealing resin 7 and the sensor package 4 to peel off the sealing resin 7 from the sensor package 4 and the circuit board 3, and sequent separation of the bonding wires 5 from the internal conductive pads 12 or the input/output pads 21 to make the device inoperative.

Also, there is a problem that the trapped moisture dissolves ionic impurities out from the sealing resin, and an electro-chemical decomposition reaction is thereby stimulated to possibly corrode the aluminum-made input/output pads.

Furthermore, when the sealing resin 7 peels off, the spacer 22 and the cover glass 6 also come off from the imaging chip 19, along with the sealing resin 7. Consequently, the cavity surrounded by the imaging chip 19, the spacer 22, and the cover glass 6 fails to be sealed properly, and moisture enters inside the cavity to cause fog on the cover glass 6 and electrical malfunctions of the image sensor 19a.

In the present invention, the undermentioned various modifications are made to the structure, the several conditions, and the sealing resin in order to obtain the solid state imaging device able to pass the reliability test. Note that detailed explanation is omitted for the structures already mentioned in the above embodiments.

Based on a presumption that one of the reasons for peeling off of the sealing resin from the sensor package would be weakness in adhesion force between the two, a new structure is designed to improve the adhesion force.

Figure 21:
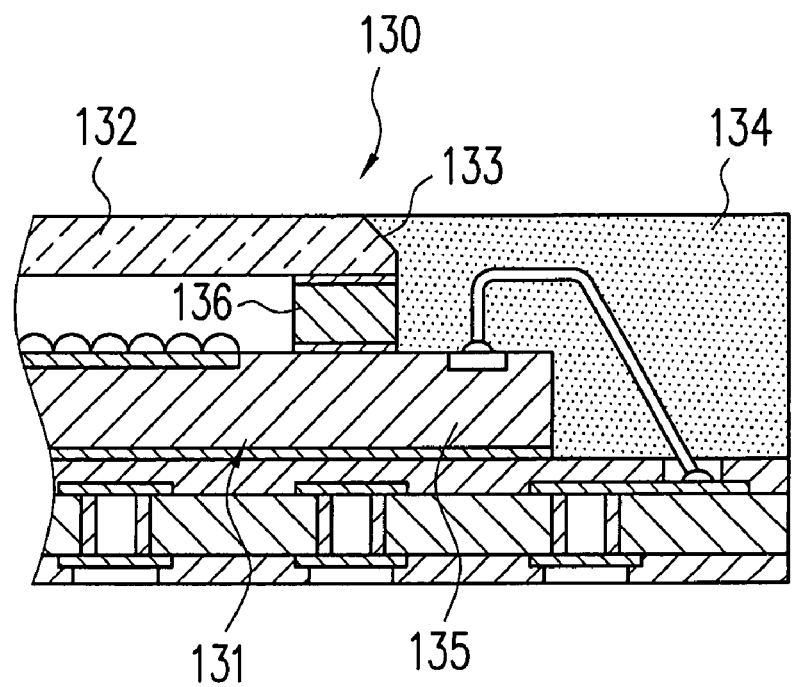
FIG. 21 is a cross sectional view of the solid state imaging device provided with a chamfered section on the outer edge of the cover glass.

A solid state imaging device 130, shown in FIG. 21, is provided with a chamfered section 133 running along the peripheral edge of a cover glass 132 of a sensor package 131. Since the chamfered section 133 operates to broaden the contact area of sealing resin 134 and the sensor package 131, the adhesion force increases on the sealing resin 134 to produce an anchor effect that prevents the peeling off of the sealing resin 134 from the sensor package 131. In addition, even when the cavity between the imaging chip 135, the spacer 136, and the cover glass 132 gets high temperature to increase the pressure therein, the reaction force that acts on cover glass 132 serves to enhance the sealing function inside the cavity.

Figure 22:
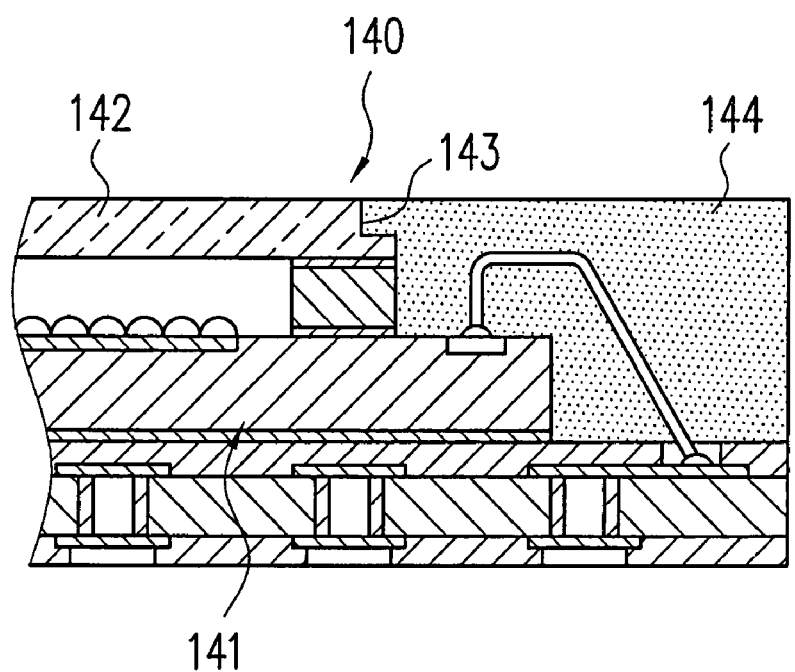
FIG. 22 is a cross sectional view of the solid state imaging device provided with a step section on the outer edge of the cover glass.

For the same purpose, a solid state imaging device 140, in FIG. 22, is provided with a step section 143 running along the peripheral edge of a cover glass 142 of a sensor package 141, so that the contact area to sealing resin 144 is broadened. The chamfered section 133 and the step section 143 have no negative effect on the image sensor 19a as long as they stay within the width of the spacer 22.

The chamfered section 133 and the step section 143 can be formed by using a slicer or a dicer, in the dicing operation to the glass substrate 28 and the silicon wafer 37, as shown in FIGS. 6D and 6E. They do not require a significant increase in the operation step, but are employed at low cost.

Figure 23:
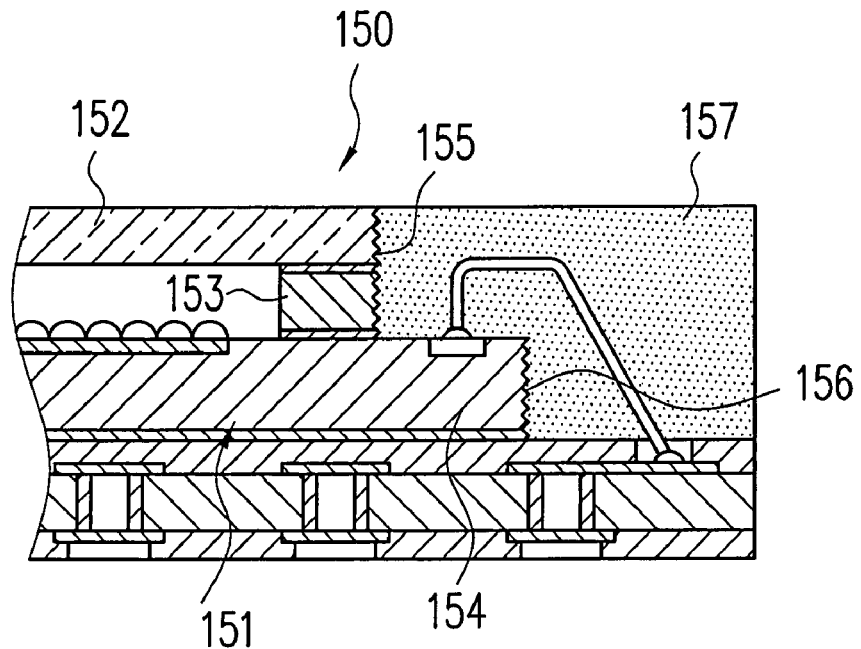
FIG. 23 is a cross sectional view of the solid state imaging device with rough surfaces shaped on the side faces of the cover glass, spacer, and the imaging chip.

Although the above embodiments are both to obtain the anchor effect at the edge of the cover glass, a solid state imaging device 150, as shown in FIG. 23, obtains the anchor effect through rough surfaces 155 and 156, formed over all the side faces of a cover glass 152 of a sensor package 151, a spacer 153, and an imaging chip 154. The rough surfaces 155 and 156 are easily shaped in an etching process or the like, which may be introduced after the dicing operation, as shown in FIG. 6E, to the glass substrate 28 and the silicon wafer 37.

Figure 24:
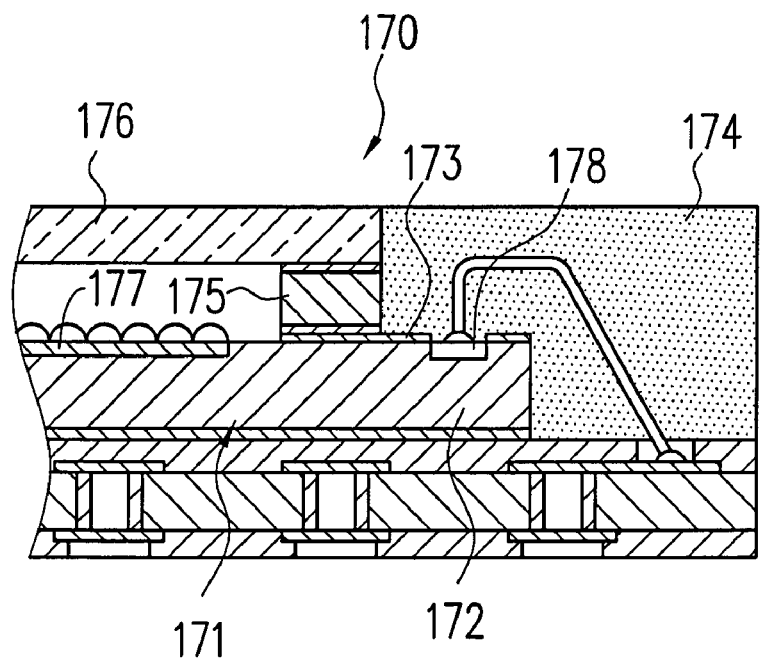
FIG. 24 is a cross sectional view of the solid state imaging device with polyimide films formed on the side faces of the cover glass, spacer, and the imaging chip.

As another method for preventing the peeling off of the sealing resin, a high adhesion film may be provided over the outer side faces of the sensor package to ensure tight contact with the sealing resin. For example, as a solid state imaging device 170 in FIG. 24, an imaging chip 172 of the sensor package 171 may be provided on the upper surface with a polyimide film 173, low defect density material. This film allows tight contact of the sealing resin 174 to the imaging chip 172, and the adhesion force increases on the sealing resin 174 to prevent the peeling off. The imaging chip 172 and a spacer 175 also make tight contact to each other, the two will hardly separate.

The polyimide film 173 can be formed in the process of, for example, forming the image sensor 177 and the input/output pads 178 in the silicone wafer 37. Conveniently, the polyimide film 173 can be used as a passivation film in the plasma etching process. Employed with the aforesaid rough surface 155, the polyimide film 173 serves to protect the upper surface of the imaging chip 172 when the rough surface is shaped by the plasma etching on the side faces of the cover glass 176, the spacer 175, and the imaging chip 172.

Figure 25:
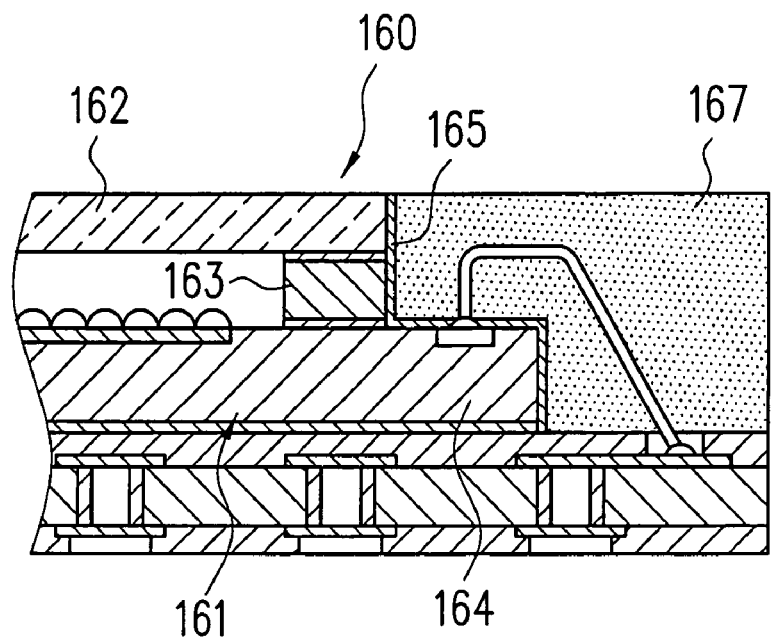
FIG. 25 is a cross sectional view of the solid state imaging device with nitride films formed on the side faces of the cover glass, spacer, and the imaging chip.

As means to enhance the sealing function for the cavity containing the image sensor, a moisture penetration preventive film can be used. As a solid state imaging device 160 in FIG. 25, a nitride film 165 is prepared by vapor deposition on the outer side faces of all a cover glass 162 for a sensor package 161, a spacer 163, and an imaging chip 164. Since the thin films operate to increase the adhesion to the sealing resin 167 and, then, the adhesion force of the sealing resin 167. Preferably, the vapor deposition of the nitride film 165 is conducted after the sensor package 4 is die-bonded onto the circuit assembly board 47 and the input/output pads 21 are wire-bonded to the inner conductive pads 12 of the circuit assembly board 47, shown in FIG. 6E. In reality, the imaging chip 164 has already had a nitride film formed in the coating process of the silicone wafer 37, and an additional nitride film will be deposited on top of that film.

The nitride thin film and the polyimide film are also effective protection against the steam explosion and the resulting cracks or the peeling off because they encourage the moisture prevention and the tight contact of the elements, blocking the moisture penetrating through the gaps between the sensor package and the circuit board.

Figure 26:
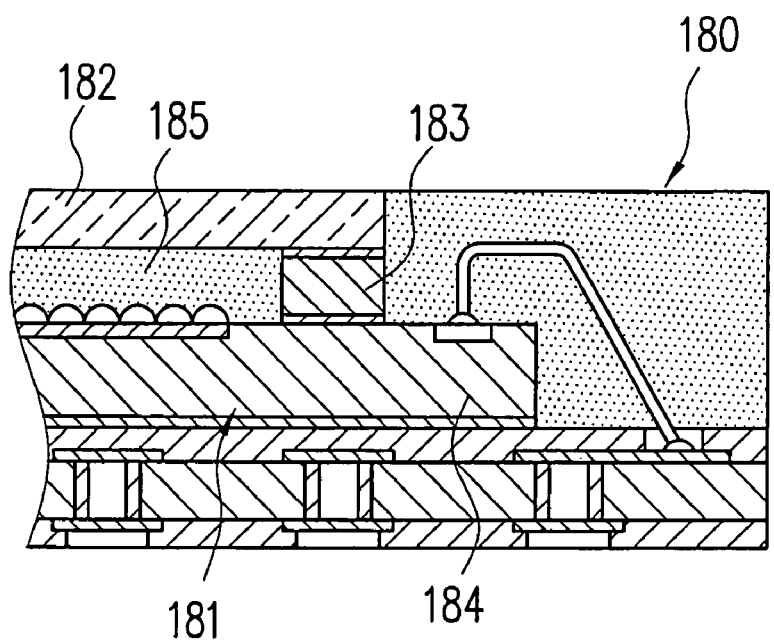
FIG. 26 is a cross sectional view of the solid state imaging device with an inactive gas filled in a cavity enclosed by the cover glass, spacer, and the imaging chip.

One of the reasons that cause the spacer to peel off from the imaging chip seems the stress on the adhesion areas caused by the thermal expansion of the air in the cavity surrounded by the imaging chip, the spacer, and the cover glass. To avoid this situation, the cavity that encloses the image sensor may form a vacuum. Alternatively, as a solid state imaging device 180 in FIG. 26, the cavity between a cover glass 182 of a sensor package 181, a spacer 183, and an imaging chip 184 may be filled with an inactive gas 185 such as N2 gas. To form a vacuum inside the cavity or fill the cavity with the inactive gas 185, the silicon wafer 37 and the glass substrate 28 are placed in a vacuum or gas-filled chamber and attached together as shown in FIG. 6B.

Figure 27:
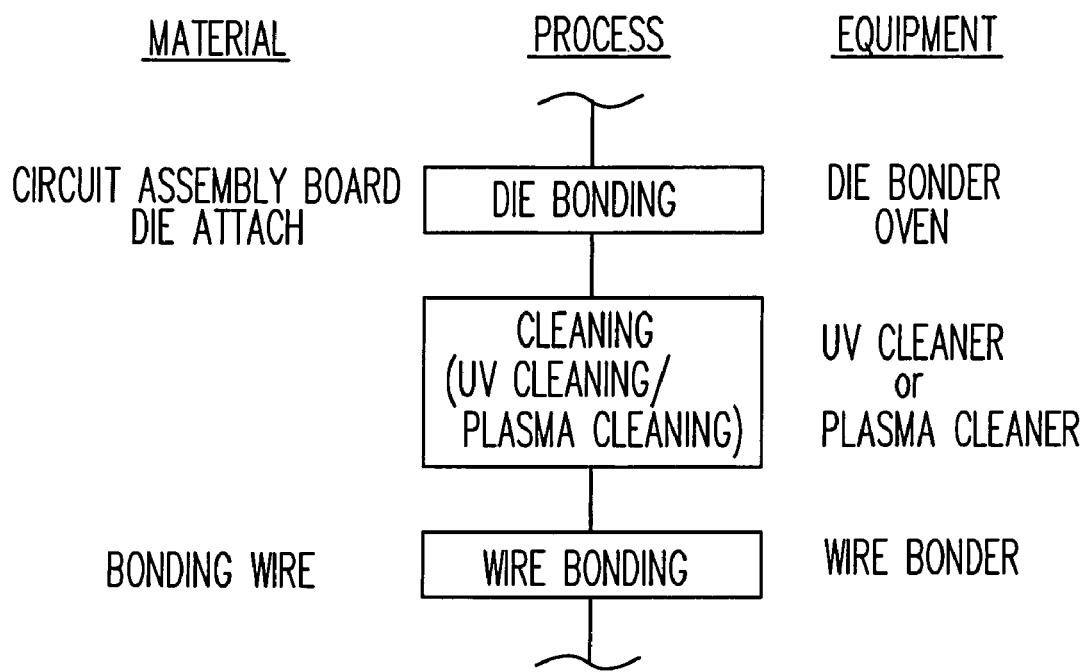
FIG. 27 is a flow chart of a manufacturing process including an UV cleaning or plasma cleaning step.

Although the peeling off of the sealing resin is prevented by the additional structures in the above embodiments, the same effect may be obtained by improving the adhesion of the nitride film previously provided on the upper surface of the imaging chip. The adhesion can be improved through a UV cleaning machine or a plasma cleaning machine. The UV cleaning machine removes organic impurities from the nitride film and improves wettability thereof, and the adhesion of the sealing resin is therefore improved. The plasma cleaning machine acts to improve wire bonding property to the input/output pads, and the increased bonding force is produced between the input/output pads and the bonding wires. As shown in FIG. 27, the UV cleaning machine or the plasma cleaning machine may replace the $O_2$ asher in the cleaning step of the first embodiment.

Figure 28:
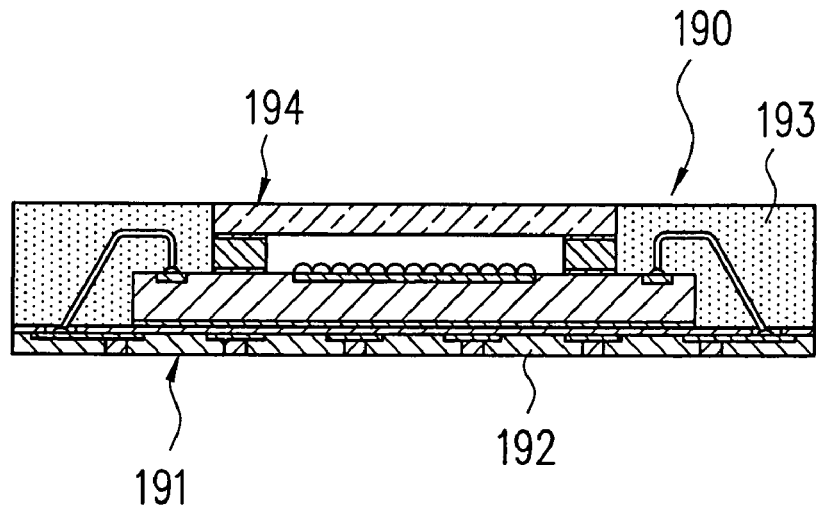
FIG. 28 is a cross sectional view of the solid state imaging device, in which the circuit board is a tape substrate made of a super heat resistant polyimide film.

The moisture directly penetrates the surface of the sealing resin, and at the same time, it penetrates through the circuit board into the sealing resin. Since the circuit board has a relatively large dimension, it can serve a lot to keep off the moisture from the sealing resin. According to this embodiment shown in FIG. 28, therefore, a solid state imaging device 190 incorporates a tape substrate 191, as the circuit board to which a sensor package 194 is attached. The tape substrate 191 includes a base 192 made of a super heat resistant polyimide film. Since the super heat resistant polyimide film drains moisture from the sealing resin 193, the possibility of the steam explosion in the sealing resin 193 is reduced. Being thinner than the glass epoxy substrates, the tape substrate 191 is also able to reduce the thickness of the solid state imaging device 190.

The super heat resistant polyimide films can be easily obtained, and one known is Kapton (registered trademark) film (product name: E.I. du Pont de Nemours & Company).

Although the sealing resin is an epoxy resin in the above embodiment, another resin with higher adhesion may be used so that the sealing resin 7 does not peel off from the sensor package 4 and the circuit board 3 in the first embodiment. The resin with high adhesion will be, for example, biphenyl type epoxy resin.

Additionally, for better molding, the sealing resin 7 may have a spiral flow of no less than 110 cm. The sealing operation for this sealing resin 7 should be performed with a sealing temperature of 165° C. to 180° C., and an injection pressure of 50 to 100 kg/cm².

It is also preferable to use the sealing resin 7 with a glass transition temperature (Tg) of no less than 130° C. to create an improved temperature cycle. In this case, a heat curing temperature (PMC temperature) is preferably higher than Tg, and is set at, for example, around 150° C.

Still another cause of the cracks and the peeling off of the sealing resin 7 is thermal stress produced between the sealing resin 7, the sensor package 4, and the circuit board 3. In the first embodiment, the sealing resin (epoxy resin) 7 has a thermal expansion coefficient ($\alpha$) of approximately 50 ppm/° C. The imaging chip 19 and the spacer 22 both made from silicon have the thermal expansion coefficient of 3 ppm/° C., and the cover glass 6 has the thermal expansion coefficient of 6 ppm/° C., then the circuit board 3 made from glass epoxy has the thermal expansion coefficient of 13 to 17 ppm/° C. Such difference in thermal expansion coefficient leads to produce the thermal stress during the molding operation, the reflowing operation, the PMC operation, and the temperature cycle in actual use, and the sealing resin 7 sometimes gets bent or twisted or cracked. To avoid this problem, it is preferable that the sealing resin has the thermal expansion coefficient of no more than 20 ppm/° C., more desirably no more than 8 ppm/° C.

Also, to reduce the thermal stress, it is preferable that the sealing resin 7 has a flexural modulus of no more than 28 GPa, and a mold shrinkage factor of no more than 0.12%. In addition, the sealing resin should have a hardness of 90 shore D and above in order to ensure a proper level of strength in the solid state imaging device to prevent the deformation thereof.

The spacer 22 and the cover glass 6 can possibly peel off from the imaging chip 19 if the adhesives 29 and 40 that bond the spacer 22 reach Tg (the glass transition temperature) in the PMC operation. It is therefore preferable to adjust Tg of the adhesives 29 and 40 to no less than 150° C., in accordance with the PMC temperature which is set at 150° C. as mentioned above. Nonetheless, the adhesive agent may have the transition temperature lower than 150° C. if the sealing resin has low thermal expansion coefficient and therefore gives less thermal stress on the adhesive agent at high temperature.

The thermal stress, due to the difference in thermal expansion coefficient, is also produced between the sensor package 4 and the circuit board 3, causing the cracks and the peeling off of the sealing resin 7. Here, the circuit board 3 made from the glass epoxy has the thermal expansion coefficient of 13 to 17 ppm/° C., while the circuit board 191 made of the super heat resistant polyimide film has the thermal expansion coefficient of 16 to 60 ppm/° C. Compared to the imaging chip 19 with the thermal expansion coefficient of 3 ppm/° C., there is a considerable difference.

To avoid the above problem, it is preferable to use a die attach film 51, which has the glass transition temperature lower than the PMC temperature. The die attach film 51 absorbs bend or twist of the imaging chip 19 and the circuit board 3 in the PMC operation, and prevents the cracks and the peeling off of the sealing resin 7. Additionally, it is preferable that the die attach film 51 has, for example, Tg of 50° C. to 80° C. and $\alpha$ of 80 to 100 ppm/° C., so that it can reach the glass transition temperature in the beginning of the PMC operation.

It is also preferable to use the sealing resin with a water absorption coefficient of no more than 0.3% by weight (saturated vapor pressure test: 20 hours), in order to prevent the moisture absorption of the sealing resin 7 that may cause the steam explosion. Furthermore, when the input/output pads 21 of the sensor package 4 need to be protected from corrosion, the sealing resin 7 should have the water absorption coefficient of no more than 0.15% by weight.

The water absorption coefficient of the sealing resin 7 can be reduced by increasing a ratio of the filler material, other than using the resin with low water absorption coefficient. For example, the sealing resin 7 in the first embodiment contains a filler material, such as silica, which occupies 73% of the whole, but there shows no improvement in the water absorption coefficient of the sealing resin. Then, a solid state imaging device is made using sealing resin with the increased ratio of the filler material to 80% and above. This solid state imaging device had less cracks and peeling under the JEDEC reliability test. It is therefore preferable to use sealing resin with the ratio of the filler material of no less than 80%.

Also, it is preferable to use low-halogen and low-alkali metal sealing resin (e.g. 10 ppm and below). Such sealing resin releases less ionic impurities, and serves to prevent the corrosion of the input/output pads.

The aforesaid various modifications prevent the cracks and the peeling off of the sealing resin, and improve the sealing efficiency for the cavity containing the image sensor as well. In addition, they can prevent the removal of the bonding wires from the pads, and contribute to prevent malfunctions of the solid state imaging device. For example, controlling the sealing resin to have the ratio of filler material of no less than 80% and the thermal expansion coefficient of no more than 20 ppm/° C. leads the solid state imaging device to survive 500 hours per 1000 cycles in the high temperature high humidity storage test and the temperature cycle test. Also, using the circuit board of the super heat resistant polyimide film enables to meet level 1 precondition of the JEDEC reliability test.

It is possible to use the aforesaid various modifications separately or in combination as appropriate. Although these modifications are explained with the solid state imaging device made according to the first embodiment, it is sure that these modifications are applied to any of the solid state imaging devices made according to the second to fifth embodiments.

Although the above embodiments are described with the solid state imaging devices of CCD type, the present invention is applicable to the manufacture of solid state imaging devices of CMOS type or the like. Also, the present invention is applicable to the manufacture of solid state imaging devices in various packages other than the FLGA, FBGA, QFN, and SIP.

INDUSTRIAL APPLICABILITY

The solid state imaging device made according to the present invention can be applied to digital cameras, mobile phones, electronic endoscopes, and some such.

The invention claimed is:

1. A method for manufacturing solid state imaging devices comprising:
   a die bonding step for adhering sensor packages to each of a plurality of bonding areas formed on a circuit assembly board, each of said sensor packages having an imaging chip provided with an image sensor and input/output pads and a translucent cover attached to said imaging chip for sealing said image sensor;
   a wire bonding step for connecting said input/output pads to internal electrodes with using bonding wires, said internal electrodes being provided in said circuit assembly board and corresponding to said sensor packages;
   a sealing step for holding an upper face of said cover and a lower face of said circuit assembly board between an upper mold die and a lower mold die, and for filling sealing resin to a cavity created between said upper mold die and lower mold die to seal peripheries of said sensor packages;
   a mold curing step for heating to cure said sealing resin;
   a singulation step for cutting said circuit assembly board and said sealing resin into individual sensor packages;
   wherein said sensor packages are adhered to said bonding areas of said circuit assembly board with sheets of die attach material; and
   wherein each of said sensor packages further includes a spacer held between said imaging chip and said translucent cover.

2. A method as described in claim 1, further comprising:
   a protection step for covering an upper face of said cover with a protection sheet before said sealing step.

3. A method as described in claim 2, wherein said protection sheet is held in said cavity of said upper mold die and covers said upper face of said cover in said sealing step.

4. A method as described in claim 2, wherein said protection sheet is larger than said image sensor but smaller than said upper face of said cover, and is attached to said upper face of said cover such that an edge of said protection sheet stay at between edges of said image sensor and said upper face of said cover.

5. A method as described in claim 2, wherein said protection sheet is larger than said upper face of said cover and covers a plurality of said sensor packages.

6. A method as described in claim 2, wherein said protection sheet has at least approximately the same size as said circuit assembly board and covers all of said sensor packages adhered on said circuit assembly board.

7. A method as described in claim 2, wherein said protection sheet protects said upper face of said cover from said sealing resin.

8. A method as described in claim 2, wherein said protection sheet protects said sensor package from pressing force of said upper mold die.

9. A method as described in claim 1, further comprising:
   an external electrode formation step between said mold curing step and said singulation step for forming external electrodes on an exterior face of said circuit assembly board, said external electrodes being connected to said internal electrodes.

10. A method as described in claim 9, wherein said circuit assembly board is a substrate board, and wherein said external electrode formation step includes a ball formation step for forming solder balls on wiring of said substrate board.

11. A method as described in claim 9, wherein said circuit assembly board is a lead frame, and wherein said external electrode formation step includes a plating step for plating outer leads of said lead frame.

12. A method as described in claim 9, wherein said circuit assembly board is a tape substrate.

13. A method as described in claim 12, wherein said tape substrate is made of a super heat resistant polyimide film.

14. A method as described in claim 12, further comprising:
   a cleaning step between said die bonding step and said wire bonding step for cleaning said sensor packages and said circuit assembly board.

15. A method as described in claim 14, wherein said cleaning step is to perform UV cleaning.

16. A method as described in claim 14, wherein said cleaning step is to perform plasma cleaning.

17. A method as described in claim 1, wherein said die attach material has a glass transition temperature lower than a heat curing temperature in said mold curing step.

18. A method as described in claim 17, wherein said die attach material has said glass transition temperature of 50° C. to 80° C. and a thermal expansion coefficient of 80 to 100 ppm/° C.

19. A method as described in claim 1, wherein said cover is attached to said imaging chip by an adhesive agent, having a glass transition temperature higher than a heat curing temperature in said mold curing step.

20. A method as described in claim 1, wherein said sealing step is performed under a sealing temperature of 165° C. to 180° C. and an injection pressure of 50 to 100 kg/cm².

21. A method as described in claim 1, wherein said sealing resin is high adhesion resin, which makes tight contact to said sensor packages and said circuit assembly board.

22. A method as described in claim 21, wherein said high adhesion resin is biphenyl type epoxy resin.

23. A method as described in claim 1, wherein said sealing resin has a spiral flow of 110 cm and above.

24. A method as described in claim 1, wherein said sealing resin has a thermal expansion coefficient of no more than 20 ppm/° C. and preferably no more than 8 ppm/° C.

25. A method as described in claim 1, wherein said sealing resin has a flexural modulus of 28 Gpa and below.

26. A method as described in claim 1, wherein said sealing resin has a mold shrinkage factor of 0.12% and below.

27. A method as described in claim 1, wherein said sealing resin has a water absorption coefficient of no more than 0.3% by weight and preferably no more than 0.15% by weight.

28. A method as described in claim 1, wherein said sealing resin has a ratio of a filler material of 80% and above.

29. A method as described in claim 1, wherein said sealing resin has a glass transition temperature of 130° C. and above.

30. A method as described in claim 1, wherein said sealing resin has a hardness of 90 shore D and above.

31. A method as described in claim 1, wherein said sealing resin has a curing temperature of approximately 150° C.

32. A method as described in claim 1, wherein said sealing resin contains halogen and an alkali metal of no more than 10 ppm respectively.

33. The method as described in claim 1, further comprising:
after said singulation step, forming rough surfaces on side faces of said imaging chip, said spacer and said translucent cover.

34. A method for manufacturing solid state imaging devices comprising:
a die bonding step for adhering sensor packages to each of a plurality of bonding areas formed on a circuit assembly board, each of said sensor packages having an imaging chip provided with an image sensor and input/output pads and a translucent cover attached to said imaging chip for sealing said image sensor;
a wire bonding step for connecting said input/output pads to internal electrodes with using bonding wires, said internal electrodes being provided in said circuit assembly board and corresponding to said sensor packages;
a sealing step for holding an upper face of said cover and a lower face of said circuit assembly board between an upper mold die and a lower mold die, and for filling sealing resin to a cavity created between said upper mold die and lower mold die to seal peripheries of said sensor packages;
a mold curing step for heating to cure said sealing resin; and
a singulation step for cutting said circuit assembly board and said sealing resin into individual sensor packages,
wherein said sensor packages are adhered to said bonding areas of said circuit assembly board with sheets of die attach material,
said method further comprising:
before said die bonding step, providing a polyimide film on an upper surface of said imaging chip.

35. The method as described in claim 1, further comprising:
after said wire bonding step, forming moisture penetration preventive films on side faces of said imaging chip, said spacer and said translucent cover.

36. The method as described in claim 35, wherein said moisture penetration preventive films are nitrogen films.

37. A method for manufacturing solid state imaging devices comprising:
a die bonding step for adhering sensor packages to each of a plurality of bonding areas formed on a circuit assembly board, each of said sensor packages having an imaging chip provided with an image sensor and input/output pads and a translucent cover attached to said imaging chip for sealing said image sensor;
a wire bonding step for connecting said input/output pads to internal electrodes with using bonding wires, said internal electrodes being provided in said circuit assembly board and corresponding to said sensor packages;
a sealing step for holding an upper face of said cover and a lower face of said circuit assembly board between an upper mold die and a lower mold die, and for filling sealing resin to a cavity created between said upper mold die and lower mold die to seal peripheries of said sensor packages;
a mold curing step for heating to cure said sealing resin; and
a singulation step for cutting said circuit assembly board and said sealing resin into individual sensor packages,
wherein said sensor packages are adhered to said bonding areas of said circuit assembly board with sheets of die attach material,
said method further comprising:
between said die bonding step and said wire bonding step, conducting UV cleaning or plasma cleaning.

38. A method for manufacturing solid state imaging devices comprising:
a die bonding step for adhering sensor packages to each of a plurality of bonding areas formed on a circuit assembly board, each of said sensor packages having an imaging chip provided with an image sensor and input/output pads and a translucent cover attached to said imaging chip for sealing said image sensor;
a wire bonding step for connecting said input/output pads to internal electrodes with using bonding wires, said internal electrodes being provided in said circuit assembly board and corresponding to said sensor packages;
a sealing step for holding an upper face of said cover and a lower face of said circuit assembly board between an upper mold die and a lower mold die, and for filling sealing resin to a cavity created between said upper mold die and lower mold die to seal peripheries of said sensor packages;
a mold curing step for heating to cure said sealing resin; and
a singulation step for cutting said circuit assembly board and said sealing resin into individual sensor packages,
wherein said sensor packages are adhered to said bonding areas of said circuit assembly board with sheets of die attach material, and
wherein said circuit assembly board is a tape substrate including a base made of a super heat resistant polyimide film.

39. The method as described in claim 1, further comprising:
controlling said sealing resin to have a ratio of a filler material of no less than 80%.

* * * * *